(12) United States Patent
Fonseca et al.

(10) Patent No.: US 8,568,964 B2
(45) Date of Patent: *Oct. 29, 2013

(54) FLOOD EXPOSURE PROCESS FOR DUAL TONE DEVELOPMENT IN LITHOGRAPHIC APPLICATIONS

(75) Inventors: Carlos A. Fonseca, Fishkill, NY (US); Mark Somervell, Austin, TX (US); Steven Scheer, Austin, TX (US); Wallace P. Printz, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 780 days.

This patent is subject to a terminal disclaimer.

(21) Appl. No.: 12/430,203

(22) Filed: Apr. 27, 2009

(65) Prior Publication Data

US 2010/0273099 A1    Oct. 28, 2010

(51) Int. Cl.
*G03F 7/30* (2006.01)
(52) U.S. Cl.
CPC ..................... *G03F 7/30* (2013.01)
USPC ........................................... 430/394; 430/311
(58) Field of Classification Search
CPC ........................................................ G03F 7/30
USPC ................................................... 430/394, 311
See application file for complete search history.

(56) References Cited

U.S. PATENT DOCUMENTS

| | | | |
|---|---|---|---|
| 5,776,660 A | 7/1998 | Hakey et al. | |
| 5,861,330 A | 1/1999 | Baker et al. | |
| 5,882,967 A | 3/1999 | Brown et al. | |
| 5,906,910 A | 5/1999 | Nguyen et al. | |
| 5,955,222 A | 9/1999 | Hibbs et al. | |
| 5,972,570 A | 10/1999 | Bruce et al. | |
| 5,976,768 A | 11/1999 | Brown et al. | |
| 5,981,148 A | 11/1999 | Brown et al. | |
| 6,007,968 A | 12/1999 | Furukawa et al. | |
| 6,100,143 A | 8/2000 | Brown et al. | |
| 6,184,041 B1 | 2/2001 | Furukawa et al. | |
| 6,190,829 B1 | 2/2001 | Holmes et al. | |
| 6,207,540 B1 | 3/2001 | Furukawa et al. | |
| 6,210,866 B1 | 4/2001 | Furukawa et al. | |
| 6,218,704 B1 | 4/2001 | Brown et al. | |
| 6,221,562 B1 | 4/2001 | Boyd et al. | |
| 6,242,344 B1 | 6/2001 | Koh et al. | |
| 6,284,439 B1 | 9/2001 | Holmes et al. | |
| 6,294,419 B1 | 9/2001 | Brown et al. | |
| 6,316,309 B1 | 11/2001 | Holmes et al. | |
| 6,338,934 B1 | 1/2002 | Chen et al. | |
| 6,348,301 B1 | 2/2002 | Lin | |
| 6,387,783 B1 | 5/2002 | Furukawa et al. | |

(Continued)

FOREIGN PATENT DOCUMENTS

EP    1 939 691 A2    7/2008
JP    2000199953 A    7/2000

OTHER PUBLICATIONS

M. Asano, Sub-100nm Lithography with KrF Exposure Using Multiple Development Method, Jpn. J Appl. Phys. vol. 38 (1999), 6999-7003.

(Continued)

*Primary Examiner* — John Chu
(74) *Attorney, Agent, or Firm* — Wood, Herron & Evans, LLP

(57) ABSTRACT

A method and system for patterning a substrate using a dual tone development process is described. The method and system comprise a flood exposure of the substrate to improve process latitude for the dual tone development process.

14 Claims, 15 Drawing Sheets

(56) References Cited

U.S. PATENT DOCUMENTS

| | | |
|---|---|---|
| 6,627,361 B2 | 9/2003 | Bula et al. |
| 2004/0033440 A1 | 2/2004 | Maeda et al. |
| 2006/0160028 A1 | 7/2006 | Lee et al. |
| 2006/0194154 A1 | 8/2006 | Chen et al. |
| 2007/0077526 A1 | 4/2007 | Finders |
| 2007/0269749 A1 | 11/2007 | Schenker |
| 2008/0009138 A1 | 1/2008 | Lee |
| 2008/0038675 A1 | 2/2008 | Nagasaka |
| 2008/0113157 A1 | 5/2008 | Lee et al. |
| 2008/0187860 A1 | 8/2008 | Tsubaki et al. |
| 2009/0068589 A1 | 3/2009 | Fedynyshyn |

OTHER PUBLICATIONS

S. Tarutani et al., Development of Materials and Processes for 32nm Node Immersion Lithography Process, 4th International Symposium on Immersion Lithography, Keystone Colorado, 2007.

S. Tarutani et al., Development of Materials and Processes for Double Patterning Toward 32nm Node 193nm Immersion Lithography Process, SPIE Advanced Lithography Conference, San Jose, California, 2008, 30 pp.

U.S. Patent and Trademark Office, Final Office Action issued in related U.S. Appl. No. 12/198,850 dated Dec. 16, 2011, 16 pp.

International Searching Authority, International Search Report and Written Opinion, International Application No. PCT/US09/55084, Mailed Oct. 20, 2009, 11 pp.

U.S. Patent and Trademark Office, Non-final Office Action issued in related U.S. Appl. No. 12/198,853 dated Apr. 5, 2011, 10 pp.

International Searching Authority, International Search Report and Written Opinion, International Application No. PCT/US10/31607, Mailed Jun. 10, 2010, 7 pages.

U.S. Patent and Trademark Office, Non-final Office Action issued in related U.S. Appl. No. 12/198,850 dated May 11, 2011, 27 pp.

Machine English language translation of JP2000-199953, published Jul. 2000.

U.S. Patent and Trademark Office, Non-final Office Action issued in related U.S. Appl. No. 12/636,211, dated Mar. 16, 2012, 29 pp.

US 8,568,964 B2

FLOOD EXPOSURE PROCESS FOR DUAL TONE DEVELOPMENT IN LITHOGRAPHIC APPLICATIONS

CROSS-REFERENCE TO RELATED APPLICATIONS

This application is related to pending U.S. patent application Ser. No. 12/198,850, entitled "METHOD OF PATTERNING A SUBSTRATE USING DUAL TONE DEVELOPMENT", filed on Aug. 26, 2008. The entire content of this application is herein incorporated by reference.

BACKGROUND OF THE INVENTION

1. Field of the Invention

The invention relates to a method for patterning a substrate. In particular, the invention relates to a method for patterning a substrate using dual tone development.

2. Description of Related Art

In material processing methodologies, such as those used in the fabrication of micro-electronic devices, pattern etching is often utilized to define the intricate patterns associated with various integrated circuit elements. Pattern etching comprises applying a patterned layer of radiation-sensitive material, such as photo-resist, to a thin film on an upper surface of a substrate, and transferring the pattern formed in the layer of radiation-sensitive material to the underlying thin film by etching.

The patterning of the radiation-sensitive material generally involves coating an upper surface of the substrate with a thin film of radiation-sensitive material and then exposing the thin film of radiation-sensitive material to a pattern of radiation by projecting radiation from a radiation source through a mask using, for example, a photolithography system. Thereafter, a developing process is performed, during which the removal of the irradiated regions of the radiation-sensitive material occurs (as in the case of positive-tone photo-resist), or the removal of non-irradiated regions occurs (as in the case of negative-tone photo-resist). The remaining radiation-sensitive material exposes the underlying substrate surface in a pattern that is ready to be etched into the surface.

As an example, for positive-tone pattern development, a typical lithographic patterning technique is shown in FIGS. 1A and 1B. As shown in FIG. 1A, a layer of positive-tone photo-resist 102 is formed on a substrate 101. The layer of photo-resist 102 is exposed to electromagnetic (EM) radiation 107 through a mask 103. Mask 103 includes transparent portions 104 and opaque portions 108 that form a pattern, as shown in FIG. 1A. A distance (or pitch) 109 between opaque portions 108 is shown in FIG. 1A. The transparent portions 104 transmit EM radiation 107 to the layer of positive-tone photo-resist 102, and the opaque portions 108 prevent EM radiation 107 from being transmitted to the layer positive-tone photo-resist 102. FIG. 1A shows the layer of positive-tone photo-resist 102 having exposed portions 105 that are exposed to EM radiation 107 and unexposed portions 106 that are not exposed to EM radiation 107. As shown in FIG. 1A, opaque portions 108 are imaged onto the layer of positive-tone photo-resist 102 to produce corresponding photo-resist features aligned with unexposed portions 106.

As shown in FIG. 1B, after removing exposed portions 105 of the layer of positive-tone photo-resist 102, unexposed portions 106 remain on substrate 101 and form the pattern transferred from mask 103 to substrate 101. As shown in FIGS. 1A and 1B, opaque portions 108 are imaged onto the layer of positive-tone photo-resist 102 to produce corresponding photo-resist features (i.e., unexposed portions 106). As shown in FIGS. 1A and 1B, pitch 110 between unexposed portions 106 is determined by pitch 109 between opaque portions 108 of mask 103.

As another example, for negative-tone pattern development, a typical lithographic patterning technique is shown in FIGS. 2A and 2B. As shown in FIG. 2A, a layer of negative-tone photo-resist 202 is formed on a substrate 201. The layer of negative-tone photo-resist 202 is exposed to the EM radiation 207 through a mask 203. The mask 203 includes transparent portions 204 that form a pattern and opaque portions 208, as shown in FIG. 2A. A distance (pitch) 209 between transparent portions 204 is shown in FIG. 2A. Transparent portions 204 transmit EM radiation 207 to the layer of negative-tone photo-resist 202, and opaque portions 208 prevent EM radiation 207 from being transmitted to the layer of negative-tone photo-resist 202. FIG. 2A shows the layer of negative-tone photo-resist 202 having exposed portions 205 that are exposed to EM radiation 207 and unexposed portions 206 that are not exposed to EM radiation 207. As shown in FIG. 1A, transparent portions 204 are imaged onto the layer of negative-tone photo-resist 202 to produce corresponding photo-resist features aligned with exposed portions 205.

As shown in FIG. 2B, after removing unexposed portions 206 of the layer of negative-tone photo-resist 202, exposed portions 205 remain on substrate 201 and form a pattern transferred from mask 203 to substrate 201. As shown in FIGS. 2A and 2B, opaque portions 204 are imaged onto the layer of negative-tone photo-resist 202 to produce corresponding photo-resist features (i.e., exposed portions 205). Pitch 210 between exposed portions 205 is determined by pitch 209 between features 204 of mask 203, as shown in FIGS. 2A and 2B.

Photolithographic systems for performing the above-described material processing methodologies have become a mainstay of semiconductor device patterning for the last three decades, and are expected to continue in that role down to 32 nm resolution, and less. Typically, in both positive-tone and negative-tone pattern development, the minimum distance (i.e., pitch) between the center of features of patterns transferred from the mask to the substrate by a lithography system defines the patterning resolution.

As indicated above, the patterning resolution ($r_o$) of a photolithographic system determines the minimum size of devices that can be made using the system. Having a given lithographic constant $k_1$, the resolution is given by the equation $$r_o = k_1 \lambda / NA, \qquad (1)$$

where $\lambda$ is the operational wavelength of the EM radiation, and NA is the numerical aperture given by the equation $$NA = n \sin \theta_o. \qquad (2)$$

Angle $\theta_o$ is the angular semi-aperture of the photo-lithography system, and n is the index of refraction of the material filling the space between the system and the substrate to be patterned.

Following equation (1), conventional methods of resolution improvement have lead to three trends in photolithographic technology: (1) reduction in wavelength $\lambda$ from mercury g-line (436 nm) to the 193 nm excimer laser, and further to 157 nm and the still developing extreme-ultraviolet (EUV) wavelengths; (2) implementation of resolution enhancement techniques (RETs) such as phase-shifting masks, and off-axis illumination that have lead to a reduction in the lithographic constant $k_1$ from approximately a value of 0.6 to values approaching 0.25; and (3) increases in the numerical aperture (NA) via improvements in optical designs, manufacturing techniques, and metrology. These latter improvements have created increases in NA from approximately 0.35 to values greater than 1.35.

Immersion lithography provides another possibility for increasing the NA of an optical system, such as a lithographic system. In immersion lithography, a substrate is immersed in a high-index of refraction fluid (also referred to as an immersion medium), such that the space between a final optical element and the substrate is filled with a high-index fluid (i.e., n>1). Accordingly, immersion provides the possibility of increasing resolution by increasing the NA (see equations (1) and (2)).

However, many of these approaches, including EUV lithography, RET lithography, and immersion lithography, have added considerable cost and complexity to lithography equipment. Furthermore, many of these approaches continue to face challenges in integration and challenges in extending their resolution limits to finer design nodes.

Therefore, another trend in photolithographic technology is to utilize a double patterning approach, which has been introduced to allow the patterning of smaller features at a smaller pitch than what is currently possible with standard lithographic techniques. One approach to reduce the feature size is to use standard lithographic pattern and etch techniques on the same substrate twice, thereby forming larger patterns spaced closely together to achieve a smaller feature size than would be possible by single exposure. During double patterning, a layer of radiation-sensitive material on the substrate is exposed to a first pattern, the first pattern is developed in the radiation-sensitive material, the first pattern formed in the radiation-sensitive material is transferred to an underlying layer using an etching process, and then this series of steps is repeated for a second pattern, while shifting the second pattern relative to the first pattern. Herein, the double patterning approach may require an excessive number of steps, including exiting the coating/developing tool and re-application of a second layer of radiation-sensitive material.

Another approach to double the resolution of a lithographic pattern is to utilize a dual tone development approach, wherein a layer of radiation-sensitive material on the substrate is exposed to a pattern of radiation, and then a double pattern is developed into the layer of radiation-sensitive material by performing a positive-tone development and a negative-tone development. However, current dual tone development approaches lack the ability to adjust, control and/or optimize the double pattern formed on the substrate.

SUMMARY OF THE INVENTION

The invention relates to a method and system for patterning a substrate using a dual tone development process. The method and system comprise a flood exposure of the substrate to improve process latitude for the dual tone development process.

According to an embodiment, a method of patterning a substrate using a dual tone development process is described. The method comprises forming a layer of radiation-sensitive material on a substrate. Thereafter, the method comprises performing a patterned exposure of the layer of radiation-sensitive material, performing a first post-exposure bake following the performing the patterned exposure, and performing positive-tone developing of the layer of radiation-sensitive material to remove first radiation-sensitive material portions from the substrate. Furthermore, the method comprises performing a flood exposure of the layer of radiation-sensitive material, performing a second post-exposure bake following the performing the flood exposure; and performing negative-tone developing of the layer of radiation-sensitive material to remove second radiation-sensitive material portions from the substrate.

According to another embodiment, a platform configured for patterning a substrate using a dual tone development process is described. The platform comprises: a track system configured to coat a substrate with a layer of radiation-sensitive material; a lithography system including a pattern exposure system configured to expose the substrate to patterned EM radiation; a flood exposure system configured to expose the substrate to un-patterned EM radiation; and a transfer system configured to transfer the substrate between the track system, the pattern exposure system, and the flood exposure system.

DETAILED DESCRIPTION OF EXEMPLARY EMBODIMENTS

Figure 1A:
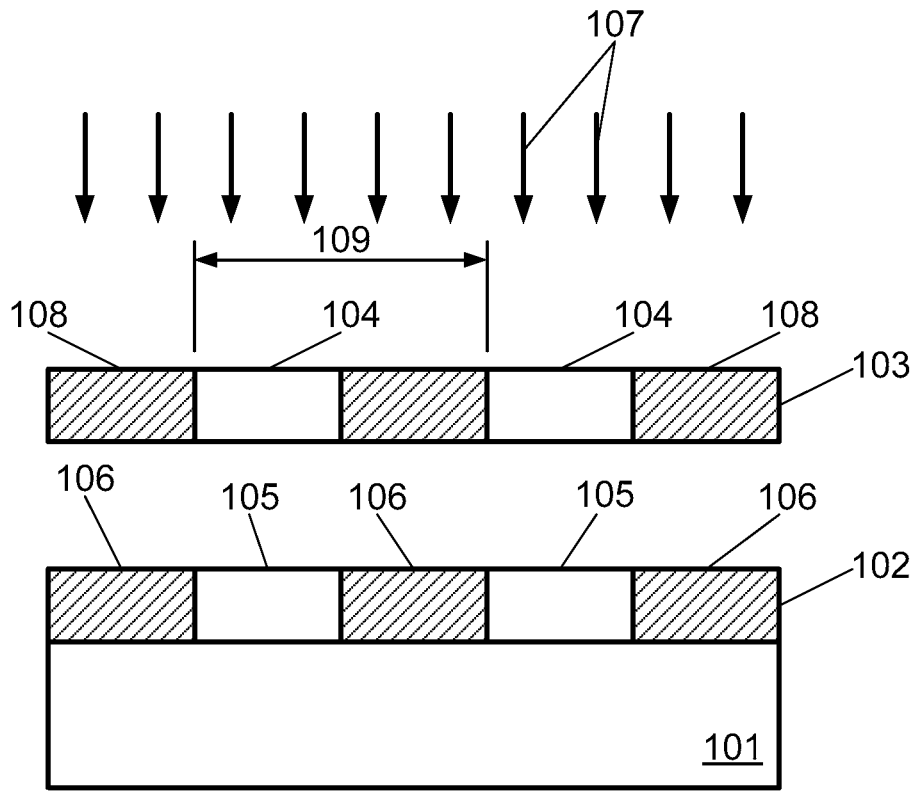
FIGS. 1A and 1B illustrate a lithographic patterning technique utilizing a positive-tone photo-resist according to the prior art.
Figure 1B:
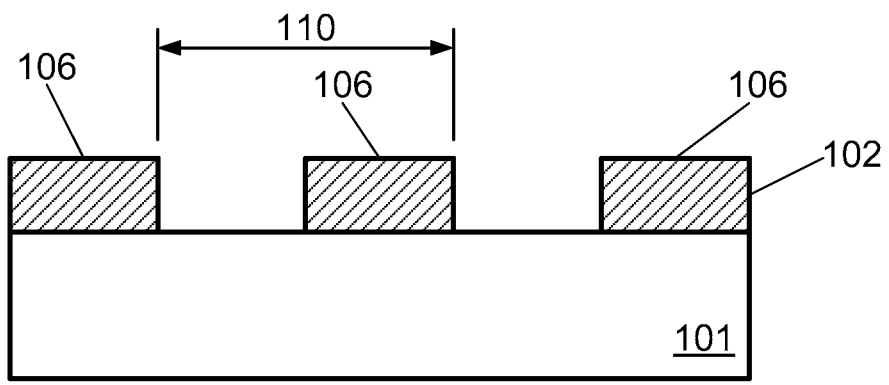
Figure 2A:
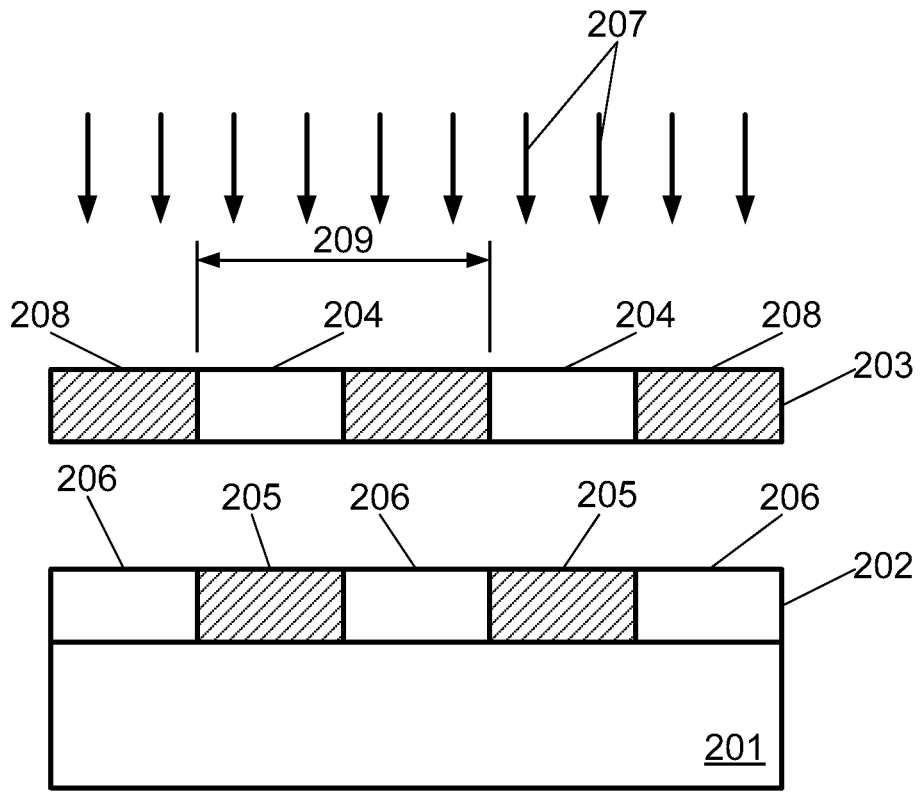
FIGS. 2A and 2B illustrate a lithographic patterning technique utilizing a negative-tone photo-resist according to the prior art.
Figure 2B:
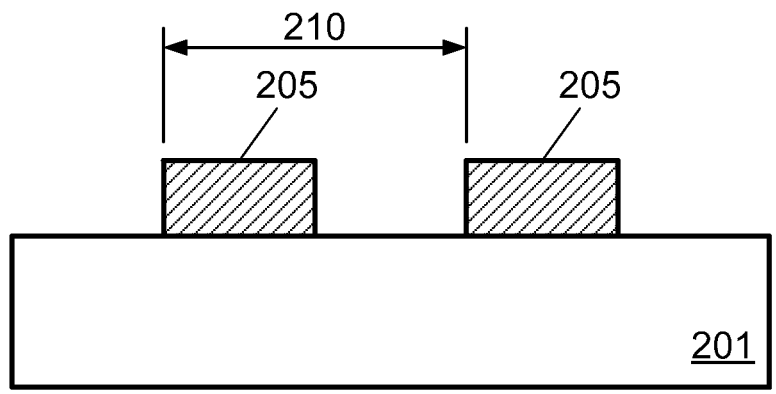

A method and system for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Methods for patterning a substrate, including methods to reduce the minimum pitch of a pattern that can be transferred onto a substrate for a given lithographic tool and mask, are described herein. Multiple chemical treatments on exposed radiation-sensitive materials, such as photo-resist, are used to achieve a reduction in a lithographic pitch of about a factor of two.

According to an embodiment, a method of patterning a substrate to double the resolution of a lithographic pattern is described. The patterning process utilizes a dual tone development (DTD) approach, wherein a layer of radiation-sensitive material applied to the substrate is exposed to a pattern of radiation, and then a double pattern is developed into the layer of radiation-sensitive material by performing a positive-tone development followed by a negative-tone development. Additionally, a process latitude for the negative-tone development is modified, increased, and/or improved by inserting a flood exposure of the layer of radiation-sensitive material prior to the negative-tone development. Furthermore, a critical dimension of the features formed in the double pattern may be adjusted, controlled and/or optimized to meet pre-specified pattern requirements that may include a pre-specified critical dimension. This adjusting, controlling and/or optimizing include altering any process step, or altering a combination of steps in the double patterning process. For example, the altering of any step or a combination of steps may include adding, subtracting, and/or re-ordering the combination of steps.

Figure 3:
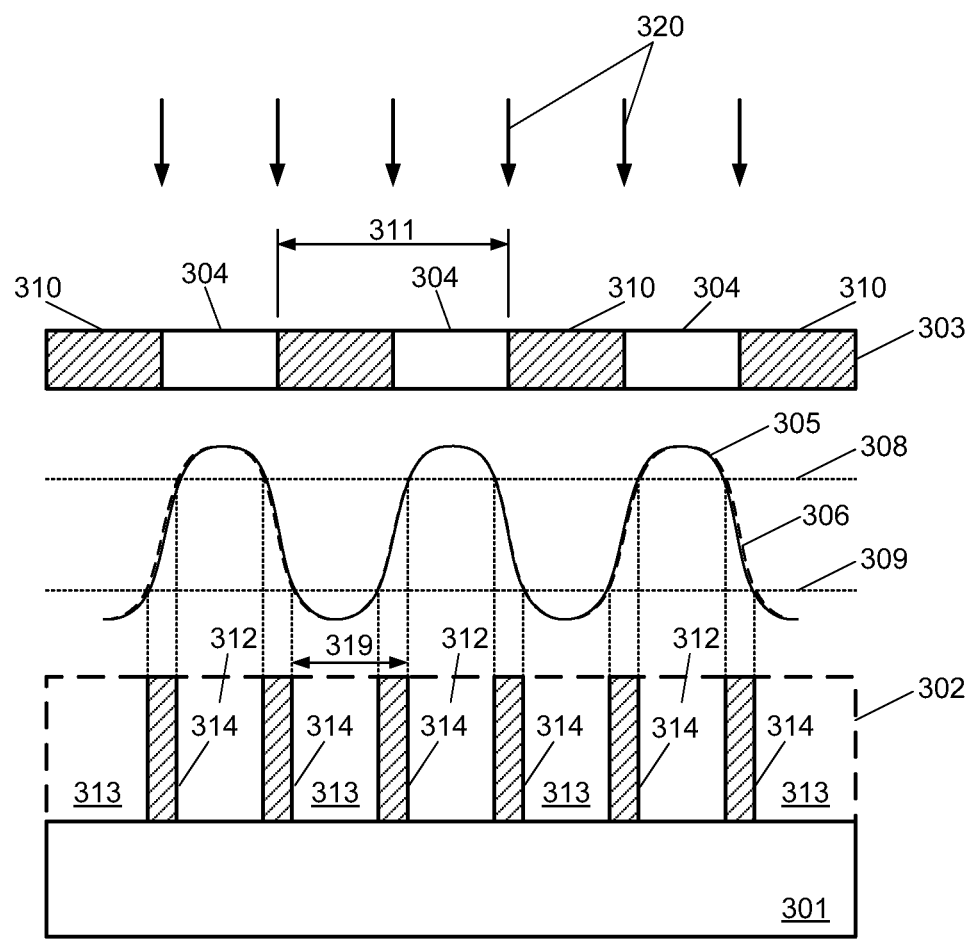
FIG. 3 illustrates a method of patterning a substrate.

FIG. 3 illustrates a method of transferring a pattern from a mask onto a substrate according to one embodiment. A layer of radiation-sensitive material 302, such as photo-resist, is formed on a substrate 301, and then it is exposed to radiation 320 from a radiation source of a lithography system (not shown) using a mask 303. Mask 303 has opaque portions 310 that are periodically spaced at a mask pitch 311 and transparent portions 304, as shown in FIG. 3.

According to one embodiment, the layer of radiation-sensitive material 302 comprises photo-resist. According to another embodiment, the layer of radiation-sensitive material 302 comprises a 248 nm photo-resist, a 193 nm photo-resist, a 157 nm photo-resist, or an extreme ultraviolet photo-resist, or a combination of two or more thereof. According to another embodiment, the layer of radiation-sensitive material 302 comprises a positive-tone photo-resist, or a negative-tone photo-resist. According to another embodiment, the layer of radiation-sensitive material 302 comprises a dual tone photo-resist. A dual tone photo-resist may be characterized as a photo-resist that behaves as a positive-tone photo-resist or a negative-tone photo-resist depending upon the developing chemistry that is utilized. According to another embodiment, the layer of radiation-sensitive material 302 comprises a photo-resist that switches solubility due to a change in polarity upon performing a patterned exposure, performing a flood exposure, performing a first post-exposure bake following the patterned exposure, or performing a second post-exposure bake following the flood exposure, or any combination of two or more thereof. According to another embodiment, the layer of radiation-sensitive material 302 comprises a photo-resist that provides acid-catalyzed deprotection upon performing a patterned exposure, performing a flood exposure, performing a first post-exposure bake following the patterned exposure, or performing a second post-exposure bake following the flood exposure, or any combination of two or more thereof. According to yet another embodiment, the layer of radiation-sensitive material 302 comprises one or more photo-acid generators.

FIG. 3 shows a radiation exposure profile 305 and a resist response profile 306 of a response produced in the layer of radiation-sensitive material 302 by a pattern of radiation resulting from the projection of radiation 320 through mask 303 using the lithography system. As shown in FIG. 3, first radiation-sensitive material portions 312 that correspond to transparent portions 304 receive a high radiation exposure from radiation 320, second radiation-sensitive material portions 313 that correspond to opaque portions 310 receive a low radiation exposure from radiation 320, and third radiation-sensitive material portions 314 that approximately correspond to edges of opaque portions 310 receive an intermediate radiation exposure from radiation 320. As shown in FIG. 3, the resist response profile 306 corresponding to the first radiation-sensitive material portions 312 of the layer of radiation-sensitive material 302 is higher than an upper threshold 308, while the resist response profile 306 corresponding to the second radiation-sensitive material portions 313 is lower than a lower threshold 309. Further, the resist response profile 306 corresponding to the third radiation-sensitive material portions 314 lies between the lower threshold 309 and the upper threshold 308.

In one embodiment, when the layer of radiation-sensitive material 302 includes a positive-tone photo-resist, resist response profile 306 may represent a chemical concentration of deprotected polymers in the layer of radiation-sensitive material 302 that is approximately proportional to radiation exposure profile 305, as shown in FIG. 3. In another embodiment, when the layer of radiation-sensitive material 302 includes a positive-tone photo-resist, resist response profile 306 may be an acid concentration in the layer of radiation-sensitive material 302 that is proportional to radiation exposure profile 305. In another embodiment, when the layer of radiation-sensitive material 302 includes a negative-tone photo-resist, resist response profile 306 may be an average polymer molecular weight in the layer of radiation-sensitive material 302 that is proportional to radiation exposure profile 305.

In one embodiment, upper threshold 308 corresponds to a first threshold of solubility of the layer of radiation-sensitive material 302 when a first developing chemistry is applied. In one embodiment, lower threshold 309 corresponds to a second threshold of solubility of the layer of radiation-sensitive material 302 when a second developing chemistry is applied. In one embodiment, first radiation-sensitive material portions 312 of the layer of radiation-sensitive material 302 that correspond to transparent portions 304 that have high radiation exposure in radiation exposure profile 305 are selectively removed from substrate 301 using a first developing chemistry. Second radiation-sensitive material portions 313 of the layer of radiation-sensitive material 302 that have low radiation exposure in the radiation exposure profile 305 are selectively removed from substrate 301 using a second developing chemistry. The third radiation-sensitive material portions 314 that correspond to approximately the edges of opaque portions 310 that have intermediate exposure in the radiation exposure profile 305 (i.e., radiation exposure between the upper threshold 308 and the lower threshold 309) remain on substrate 301 intact, as shown in FIG. 3. Thus, FIG. 3 shows a method of selectively removing first radiation-sensitive material portions 312 and second radiation-sensitive material portions 313 using different developing chemistries while leaving third radiation-sensitive material portions 314 on substrate 301 intact.

In one embodiment, for first radiation-sensitive material portions 312, resist response profile 306 includes a concentration of acid in the layer of radiation-sensitive material 302 that is higher than an upper threshold 308 of acid concentration. In one embodiment, upper threshold 308 represents an acid level solubility threshold of the layer of radiation-sensitive material 302. For example, if an acid concentration in the layer of radiation-sensitive material 302 is higher than the upper threshold 308 of acid concentration, the layer of radiation-sensitive material 302 becomes soluble when a first developing chemistry is applied.

In one embodiment, for second radiation-sensitive material portions 313, resist response profile 306 includes a concentration of acid in the layer of radiation-sensitive material that is lower than lower threshold 309 of acid concentration. In one embodiment, lower threshold 309 represents another acid level solubility threshold of the layer of radiation-sensitive material 302. For example, if acid concentration in the layer of radiation-sensitive material 302 is lower than lower threshold 309 of acid concentration, the layer of radiation-sensitive material 302 becomes soluble when a second developing chemistry is applied.

In one embodiment, the layer of radiation-sensitive material 302 includes an upper acid concentration threshold 308 in ranging from about 30% to about 60% of the clear field acid level and a lower acid concentration threshold 309 ranging from about 10% to about 25% of the clear field acid concentration. In one embodiment, the clear field acid concentration is defined as the acid level of the photo-resist completely exposed to radiation. In another embodiment, the clear field acid concentration is defined as the acid concentration when all the PAG (photo-acid generation) material has reacted with radiation to produce acid species.

Due to diffraction of radiation 320 by the mask 303, the third radiation-sensitive material portions 314 corresponding to intermediate radiation exposure are created. In one embodiment, third radiation-sensitive material portions 314 comprise an acid concentration between the upper acid concentration threshold 308 and the lower acid concentration threshold 309. The first radiation-sensitive material portions 312 corresponding to high radiation exposure are selectively removed from the substrate 301 using a first developing chemistry. The second radiation-sensitive material portions 313 corresponding to low radiation exposure are selectively removed from the substrate 301 using a second developing chemistry. The third radiation-sensitive material portions 314 corresponding to intermediate radiation exposure remain on substrate 301 to form a pattern transferred by mask 303 and the lithography system.

As shown in FIG. 3, two photo-resist features (i.e., third radiation-sensitive material portions 314) are produced for every one opaque portion 310, thereby doubling the amount of the pattern features on substrate 301. As a result, feature pitch 319 between the center of photo-resist features (i.e., third radiation-sensitive material portions 314) becomes twice as small as the mask pitch 311 of the mask 303, as shown in FIG. 3.

Figure 4A:
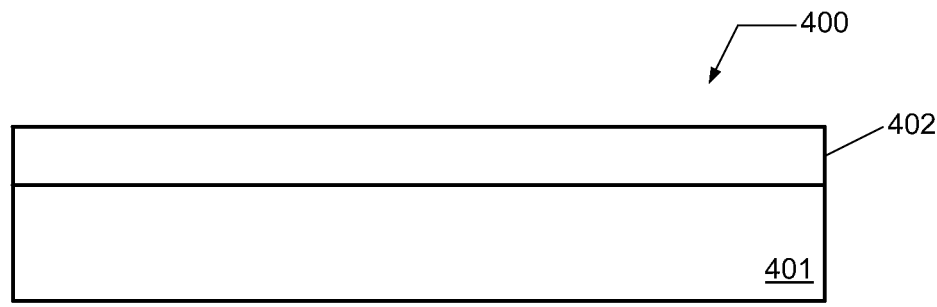
FIGS. 4A through 4E illustrate a method of patterning a substrate.

Referring now to FIGS. 4A through 4E, a method of patterning a substrate is illustrated according to another embodiment. As illustrated in FIG. 4A, a lithographic structure 400 is prepared by forming a layer of radiation-sensitive material 402 on a substrate 401.

The substrate 401 may comprise a semiconductor, e.g., a mono-crystalline silicon, germanium, and any other semiconductor. In alternate embodiments, substrate 401 may comprise any material used to fabricate integrated circuits, passive microelectronic devices (e.g., capacitors, inductors) and active microelectronic devices (e.g., transistors, photo-detectors, lasers, diodes). Substrate 401 may include insulating materials that separate such active and passive microelectronic devices from a conductive layer or layers that are formed on top of them. In one embodiment, substrate 401 comprises a p-type mono-crystalline silicon substrate that includes one or more insulating layers e.g., silicon dioxide, silicon nitride, sapphire, and other insulating materials.

As described above, the substrate 401 may comprise a film stack having one or more thin films disposed between the substrate 401 and the layer of radiation-sensitive material 402. Each thin film may comprise a conductive layer, a non-conductive layer, or a semi-conductive layer. For instance, the thin film may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7.

According to one embodiment, the layer of radiation-sensitive material 402 comprises photo-resist. According to another embodiment, the layer of radiation-sensitive material 402 comprises a 248 nm photo-resist, a 193 nm photo-resist, a 157 nm photo-resist, or an extreme ultraviolet photo-resist, or a combination of two or more thereof. According to another embodiment, the layer of radiation-sensitive material 402 comprises a positive-tone photo-resist, or a negative-tone photo-resist. According to another embodiment, the layer of radiation-sensitive material 402 comprises a dual tone photo-resist. According to another embodiment, the layer of radiation-sensitive material 402 comprises poly(hydroxystyrene)-based resist or a (meth)acrylate-based resist. According to another embodiment, the radiation-sensitive material 402 comprises a photo-resist that switches solubility due to a change in polarity upon performing a patterned exposure, performing a flood exposure, performing a first post-exposure bake following the patterned exposure, or performing a second post-exposure bake following the flood exposure, or any combination of two or more thereof. According to another embodiment, the layer of radiation-sensitive material 402 comprises a photo-resist that provides acid-catalyzed deprotection upon performing a patterned exposure, performing a flood exposure, performing a first post-exposure bake following the patterned exposure, or performing a second post-exposure bake following the flood exposure, or any combination of two or more thereof. According to yet another embodiment, the layer of radiation-sensitive material 402 comprises one or more photo-acid generators.

The layer of radiation-sensitive material 402 may be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Following the application of the layer of radiation-sensitive material 402 to substrate 401, the layer of radiation-sensitive material may be thermally treated in a post-application bake (PAB). For example, a temperature of the substrate may be elevated to about 50 degrees C. to about 200 degrees C. for a time duration of about 30 seconds to about 180 seconds. A track system having post-application substrate heating and cooling equipment may be used to perform the PAB. For example, the track system can comprise a Clean Track ACT 8, ACT 12, or Lithius resist coating and developing system commercially available from Tokyo Electron Limited (TEL). Other systems and methods for thermally treating an exposed photo-resist film on a substrate are well known to those skilled in the art of spin-on resist technology.

Figure 4B:
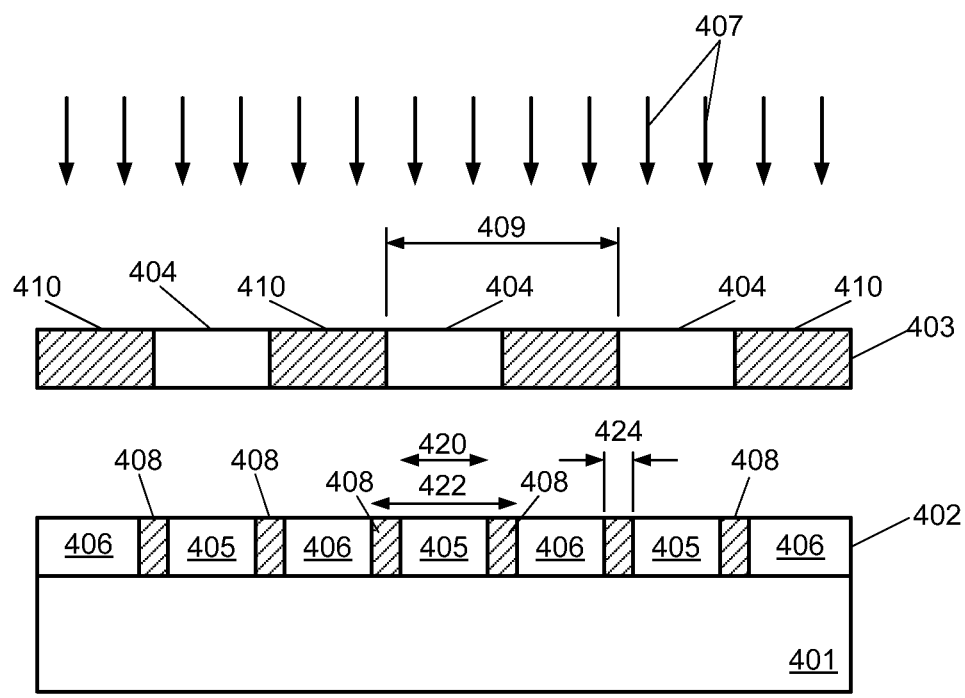

As shown in FIG. 4B, the layer of radiation-sensitive material 402 is exposed to radiation 407 through a mask 403. The mask 403 comprises opaque portions 410 that prevent radiation 407 from being transmitted to the layer of radiation-sensitive material 402 and transparent portions 404 that transmit the radiation 407 to the layer of radiation-sensitive material 402. Mask 403 may include any mask suitable for use in wet (e.g., immersion) or dry lithography, including wavelengths ranging from about 365 nm to about 13 nm. Mask 403 may include a binary mask or chrome on glass mask. Alternatively, mask 403 may include an alternating phase shift mask, or an embedded phase shift mask.

The exposure of the layer of radiation-sensitive material 402 to the pattern of EM radiation may be performed in a dry or wet photo-lithography system. The lithography system may be capable of providing a pattern of EM radiation at wavelengths of 365 nm, 248 nm, 193 nm, 157 nm, and 13 nm. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Mask 403 can be illuminated, for example, with normal incident light and off-axis illumination light, such as annular illumination, quadrupole illumination, and dipole illumination. These methods of illumination and exposing the layer of radiation-sensitive material 402 to radiation using the mask 403 are known to one of ordinary skill in the art of microelectronic device manufacturing.

As shown in FIG. 4B, radiation 407 is projected through mask 403 to the layer of radiation-sensitive material 402. The radiation exposure forms one or more first radiation-sensitive material portions 405, one or more second radiation-sensitive material portions 406, and one or more third radiation-sensitive material portions 408 in the layer of radiation-sensitive material 402. As shown in FIG. 4B, the one or more second radiation-sensitive material portions 406 that correspond to opaque portions 410 of mask 403 have low exposure to radiation 407, the one or more first radiation-sensitive material portions 405 that correspond to transparent portions 404 of mask 403 have high exposure to radiation 407, and the one or more third radiation-sensitive material portions 408 that correspond approximately to the edges of opaque portions 410 of mask 403 have an intermediate exposure to radiation 407. The one or more third radiation-sensitive material portions 408 of intermediate radiation exposure are created because of diffraction of radiation 407 from the edges of opaque portions 410.

In one embodiment, the one or more first radiation-sensitive material portions 405 corresponding to high radiation exposure receive about 50% or more of radiation 407 incident on substrate 401, the one or more second radiation-sensitive material portions 406 corresponding to low radiation exposure receive less than 15% of the radiation 407 incident on substrate 401, and the one or more third radiation-sensitive material portions 408 corresponding to intermediate radiation exposure receive between about 15% and about 50% of the radiation 407 incident on substrate 401.

In one embodiment, high exposure to radiation 407 increases the concentration of an acid in the one or more first radiation-sensitive material portions 405 to a level higher than an upper acid concentration threshold. The upper acid concentration threshold is a first solubility threshold of the layer of radiation-sensitive material 402. In one embodiment, when the concentration of the acid in the one or more first radiation-sensitive material portions 405 increases to a level higher than the first threshold of solubility of the layer of radiation-sensitive material 402 (e.g., acid concentration threshold), the one or more first radiation-sensitive material portions 405 become soluble when a first developing chemistry is applied.

In another embodiment, when the chemical concentration of de-protected polymers in the one or more first radiation-sensitive material portions 405 increases to a level higher than the first threshold of solubility of the layer of radiation-sensitive material 402 (e.g., acid concentration threshold), the one or more first radiation-sensitive material portions 405 become soluble when a first developing chemistry is applied.

In yet another embodiment, when the average polymer molecular weight in the one or more first radiation-sensitive material portions 405 increases to a level higher than the first threshold of solubility of the layer of radiation-sensitive material 402, the one or more first radiation-sensitive material portions 405 become soluble when the first developing chemistry is applied.

In the one or more second radiation-sensitive material portions 406 corresponding to low radiation exposure, a concentration of an acid and/or chemical concentration of de-protected polymers is less than a lower threshold of solubility of the layer of radiation-sensitive material 402 (e.g., acid concentration threshold). The one or more second radiation-sensitive material portions 406 become soluble when a second developing chemistry is applied.

In another embodiment, when the concentration of average polymer molecular weight in one or more second radiation-sensitive material portions 406 is lower than the second threshold of solubility of the layer of radiation-sensitive material 402, the one or more second radiation-sensitive material portions 406 become soluble when the second developing chemistry is applied.

Typically, the first solubility threshold and the second solubility threshold are determined by a material property of the layer of radiation-sensitive material 402. The one or more third radiation-sensitive material portions 408 corresponding to an intermediate radiation exposure have an acid concentration between about the first solubility threshold and the second solubility threshold. That is, the one or more third radiation-sensitive material portions 408 are not soluble when each of the first developing chemistry and the second developing chemistry is applied to layer of radiation-sensitive material 402.

Following the exposure of the layer of radiation-sensitive material 402 to EM radiation 407, the exposed layer of radiation-sensitive material 402 may be thermally treated in a first post-exposure bake (PEB). For example, a temperature of the substrate may be elevated to about 50 degrees C. to about 200 degrees C. for a time duration of about 30 seconds to about 180 seconds. A track system having post-exposure substrate heating and cooling equipment may be used to perform the PEB. For example, the track system can comprise a Clean Track ACT 8, ACT 12, or Lithius resist coating and developing system commercially available from Tokyo Electron Limited (TEL). Other systems and methods for thermally treating an exposed photo-resist film on a substrate are well known to those skilled in the art of spin-on resist technology.

Referring still to FIG. 4B, the one or more first radiation-sensitive material portions 405 may be characterized by a first critical dimension 420. For example, the first critical dimension may be related to a positive-tone critical dimension following positive-tone developing. Additionally, the one or more second radiation-sensitive material portions 406 may be characterized by a second critical dimension 422. As shown in FIG. 4B, the second critical dimension 422 represents an inner dimension of the one or more second radiation-sensitive material portions 406 (beyond which these portions exist). For example, the second critical dimension 422 may be related to a negative-tone critical dimension following negative-tone developing. Furthermore, the one or more third radiation-sensitive material portions 408 may be characterized by a third critical dimension 424. For example, the third critical dimension 424 may be related to a feature critical dimension for the features 430 (see FIG. 4D) remaining on substrate 401.

Figure 4C:
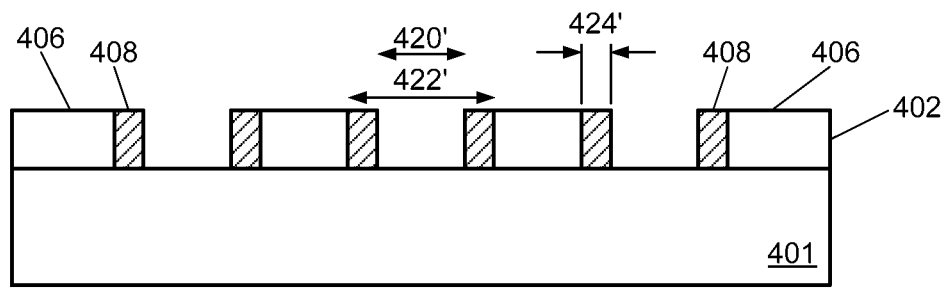

Referring now to FIG. 4C, the one or more first radiation-sensitive material portions 405 corresponding to high radiation exposure are selectively removed using a first developing process comprising a first developing chemistry. The first developing process may comprise positive-tone developing of the layer of radiation-sensitive material 402. In one embodiment, the first developing chemistry to selectively remove the one or more first radiation-sensitive material portions 405 includes a base, e.g., alkali, amines, etc. In one embodiment, the first developing chemistry to selectively remove the one or more first radiation-sensitive material portions 405 includes tetramethylammonium hydroxide (TMAH). In another embodiment, the first developing chemistry to selectively remove the one or more first radiation-sensitive material portions 405 includes a base, water, and an optional surfactant.

In one embodiment, substrate 401 having the exposed layer of radiation-sensitive material 402 is immersed into a development solution containing the first developing chemistry to remove soluble one or more first radiation-sensitive material portions 405. Thereafter, the substrate 401 is dried. The developing process may be performed for a pre-specified time duration (e.g., about 30 seconds to about 180 seconds), a pre-specified temperature (e.g., room temperature), and a pre-specified pressure (e.g., atmospheric pressure). The developing process can include exposing the substrate to a developing solution in a developing system, such as a track system. For example, the track system can comprise a Clean Track ACT 8, ACT 12, or Lithius resist coating and developing system commercially available from Tokyo Electron Limited (TEL).

As shown in FIG. 4C, a first critical dimension 420' (corresponding to the one or more first radiation-sensitive material portions 405), a second critical dimension 422' (corresponding to the one or more second radiation-sensitive material portions 406), or a third critical dimension 424' (corresponding to the one or more third radiation-sensitive material portions 408) may be adjusted, controlled, and/or optimized, as will be discussed below.

As illustrated in FIG. 4C, the one or more second radiation-sensitive material portions 406 and the one or more third radiation sensitive material portions 408 remain on substrate 401.

Figure 4D:
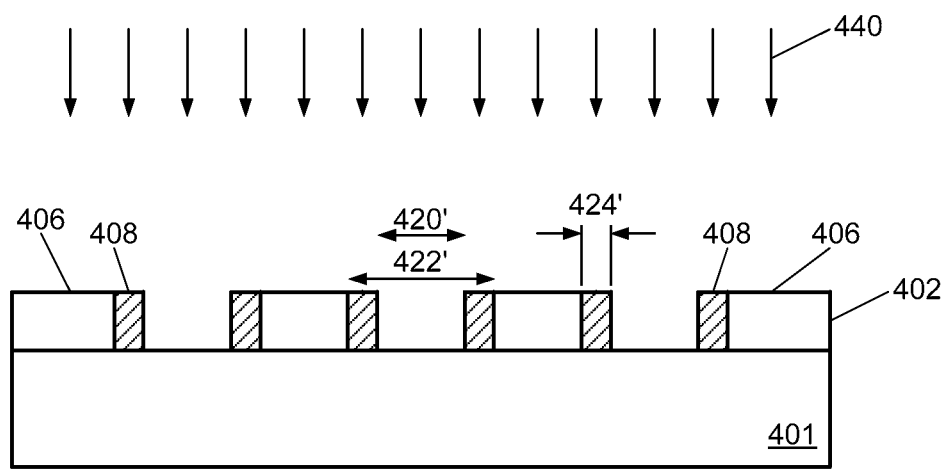

Following the first developing process of the layer of radiation-sensitive material 402, the exposed layer of radiation-sensitive material 402 is exposed to un-patterned radiation 440 (i.e., flood exposure to radiation), as shown in FIG. 4D. The exposure of the layer of radiation-sensitive material 402 to un-patterned radiation 440 will be discussed in greater detail below.

Thereafter, the layer of radiation-sensitive material 402 may be thermally treated in another post-exposure bake (PEB). For example, a temperature of the substrate 401 may be elevated to a temperature ranging from about 50 degrees C. to about 200 degrees C. for a time duration of about 30 seconds to about 180 seconds.

Figure 4E:
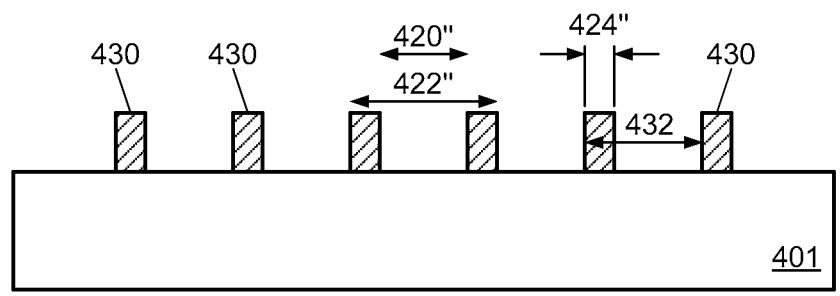

Referring now to FIG. 4E, the one or more second radiation-sensitive material portions 406 corresponding to low radiation exposure are selectively removed using a second developing process comprising a second developing chemistry. The second developing process may comprise negative-tone developing of the layer of radiation-sensitive material 402. In one embodiment, the second developing chemistry to selectively remove the one or more second radiation-sensitive material portions 406 includes an organic solvent. In one embodiment, the second developing chemistry to selectively remove the one or more second radiation-sensitive material portions 406 includes an organic solvent, optionally water, and an optional surfactant. In one embodiment, the second developing chemistry to selectively remove the one or more second radiation-sensitive material portions 406 includes an alcohol or acetone.

In one embodiment, substrate 401 having the exposed layer of radiation-sensitive material 402 is immersed into a development solution containing the second developing chemistry to remove soluble one or more second radiation-sensitive material portions 406. Thereafter, the substrate 401 is dried. The developing process may be performed for a pre-specified time duration (e.g., about 30 seconds to about 180 seconds), a pre-specified temperature (e.g., room temperature), and a pre-specified pressure (e.g., atmospheric pressure). The developing process can include exposing the substrate to a developing solution in a developing system, such as a track system. For example, the track system can comprise a Clean Track ACT 8, ACT 12, or Lithius resist coating and developing system commercially available from Tokyo Electron Limited (TEL).

As shown in FIG. 4E, a first critical dimension 420" (corresponding to the one or more first radiation-sensitive material portions 405), a second critical dimension 422" (corresponding to the one or more second radiation-sensitive material portions 406), or a third critical dimension 424" (corresponding to the one or more third radiation-sensitive material portions 408) may be adjusted, controlled, and/or optimized, as will be discussed below.

As illustrated in FIG. 4E, the one or more second radiation-sensitive material portions 406 are removed, so that the one or more third radiation sensitive material portions 408 remain on substrate 401. Since an image corresponding to each mask feature (e.g., transparent portions 404) has two regions of intermediate radiation exposure (or transitions regions ranging from low radiation intensity to high radiation intensity), the resulting resist pattern comprises twice the number of features 430 than the mask pattern on mask 403. As illustrated in FIG. 4E, for every one transparent portion 404 of mask 403, two features 430 are produced and a reduced feature pitch 432 between features 430 is achieved.

Feature pitch 432 between features 430 is less than or equal to about half of mask pitch 409 between opaque portions 410 of mask 403, as shown in FIG. 4E. In one embodiment, feature pitch 432 between features 430 may range from about 5 nm to about 30 nm.

The order of the positive-tone development (i.e., development using first developing chemistry) and the negative-tone development (i.e., development using second developing chemistry) of the layer of radiation-sensitive material 402, as described above with respect to FIGS. 4C, 4D, and 4E, may be performed in any order without changing the resulting pattern. In one embodiment, the one or more first radiation-sensitive material portions 405 corresponding to high radiation exposure are selectively removed from substrate 401 before removing the one or more second radiation-sensitive material portions 406 corresponding to low radiation exposure from substrate 401. In another embodiment, the one or more first radiation-sensitive material portions 405 corresponding to high radiation exposure are selectively removed from substrate 401 after removing the one or more second radiation-sensitive material portions 406 corresponding to low radiation exposure from substrate 401.

Figure 5:
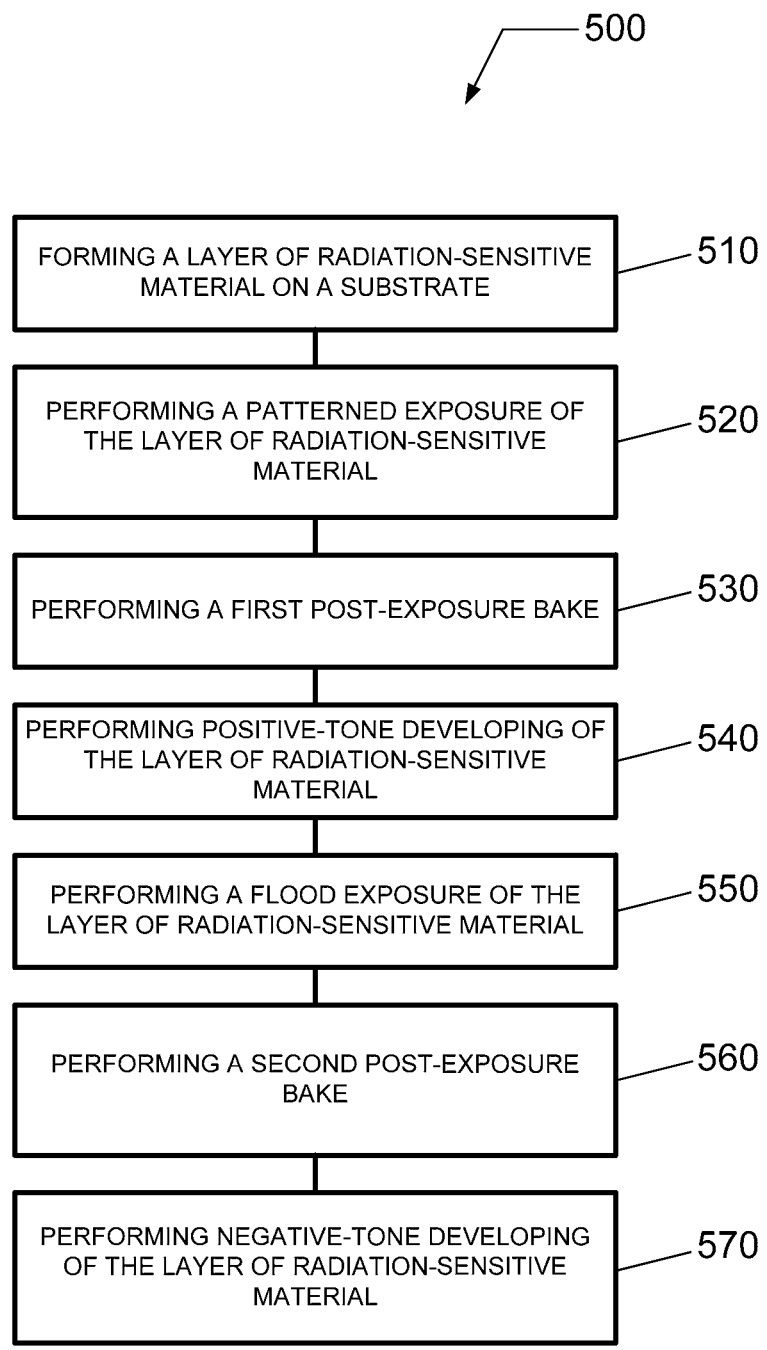
FIG. 5 illustrates a method of patterning a substrate.

Referring now to FIG. 5, a flow chart 500 of a method for patterning a substrate is presented according to an embodiment. Flow chart 500 begins in 510 forming a layer of radiation-sensitive material on a substrate and, in 520, performing a patterned exposure of the layer of radiation-sensitive material. During the patterned exposure, the layer of radiation-sensitive material is exposed to a pattern of electromagnetic (EM) radiation using a mask having a mask critical dimension (CD) to form one or more first radiation-sensitive material portions, one or more second radiation-sensitive material portions, and one or more third radiation-sensitive material portions. The mask CD may include any critical dimension to characterize opaque portions of the mask, transparent portions of the mask, mask pitch, etc. The one or more first radiation-sensitive material portions may comprise first radiation-sensitive material portions subjected to high radiation exposure. The one or more second radiation-sensitive material portions may comprise second radiation-sensitive material portions subjected to low radiation exposure. The one or more third radiation-sensitive material portions may comprise third radiation-sensitive material portions subjected to intermediate radiation exposure characterized by a third critical dimension.

In 530, a first post-exposure bake (PEB) is performed, wherein a temperature of the substrate is elevated to a first post-exposure temperature. The first PEB may comprise setting the first post-exposure temperature, a time the substrate is elevated to the first post-exposure temperature, a heating rate for achieving the first post-exposure temperature, a cooling rate for reducing the first post-exposure temperature, a pressure of a gaseous environment surrounding the substrate during the elevation of the substrate to the first post-exposure temperature, or a composition of a gaseous environment surrounding the substrate during the elevation of the substrate to the first post-exposure temperature, or a combination of two or more thereof. The first post-exposure temperature may be ramped, or stepped.

In 540, positive-tone developing of the layer of radiation-sensitive material is performed, wherein the one or more first radiation-sensitive material portions are removed from the substrate using a first developing chemistry. The removal of the one or more first radiation-sensitive material portions may be characterized by a first critical dimension. The positive-tone developing process may comprise setting a composition of the first developing chemistry, a time duration for applying the first developing chemistry, or a temperature for applying the first developing chemistry, or any combination of two or more thereof. The first developing chemistry may comprise a base solution. The first developing chemistry may further comprise a base solution, water, and an optional surfactant.

In 550, a flood exposure of the layer of radiation-sensitive material is performed. During the flood exposure, the layer of radiation-sensitive material is exposed to un-patterned radiation. The flood exposure may comprise exposing the substrate to electromagnetic (EM) radiation without a mask or reticle. The EM radiation may possess a wavelength in the visible spectrum, or a wavelength in the ultraviolet spectrum, or a combination thereof. Additionally, the flood exposure may comprise exposing the substrate to continuous EM radiation, pulsed EM radiation, poly-chromatic EM radiation, monochromatic EM radiation, broad-band EM radiation, or narrow-band radiation, or a combination thereof.

For example, the flood exposure may comprise exposing the substrate to 436 nm (nanometer) EM radiation, 365 nm EM radiation, 248 nm EM radiation, 193 nm EM radiation, 157 nm EM radiation, or deep ultraviolet (DUV) EM radiation, or any combination of two or more thereof. Additionally, for example, the flood exposure may comprise exposing the substrate to EM radiation at a wavelength capable of creating acid in the layer of radiation-sensitive material.

In 560, a second post-exposure bake (PEB) is performed, wherein a temperature of the substrate is elevated to a second post-exposure temperature. The second PEB may comprise setting the second post-exposure temperature, a time the substrate is elevated to the second post-exposure temperature, a heating rate for achieving the second post-exposure temperature, a cooling rate for reducing the second post-exposure temperature, a pressure of a gaseous environment surrounding the substrate during the elevation of the substrate to the second post-exposure temperature, or a composition of a gaseous environment surrounding the substrate during the elevation of the substrate to the second post-exposure temperature, or a combination of two or more thereof. The first post-exposure temperature may be ramped, or stepped.

In 570, negative-tone developing of the layer of radiation-sensitive material is performed, wherein the one or more second radiation-sensitive material portions are removed from the substrate using a second developing chemistry. The removal of the one or more second radiation-sensitive material portions may be characterized by a second critical dimension. The negative-tone development process may comprise setting a composition of the second developing chemistry, a time duration for applying the second developing chemistry, or a temperature for applying the second developing chemistry, or any combination of two or more thereof. The second developing chemistry may comprise an organic solvent. The second developing chemistry may further comprise an organic solvent, optionally water, and an optional surfactant.

The second post-exposure bake, and the following positive-tone developing, provides the practitioner with one approach to manipulate the de-protection reaction in the layer of radiation-sensitive material after patterned exposure in order to position the de-protection gradient a favorable position within the layer of radiation-sensitive material to result in a negative tone pattern as intended. Although this approach is successful for some resist systems, it may be limited or fail altogether with other resist systems and/or process conditions (such as photo-resist thickness, bake times/temperatures, etc.).

The flood exposure provides the practitioner with another approach to further manipulate the de-protection reaction, and allow extension of the dual tone development process to an expanded set of resist systems. The use of the flood exposure (550) and the second PEB (560) can manipulate the de-protection gradient by producing acid in the layer of radiation-sensitive material following the flood exposure and then de-protect a polymer in the layer of radiation-sensitive material further following the second PEB.

Figure 6A:
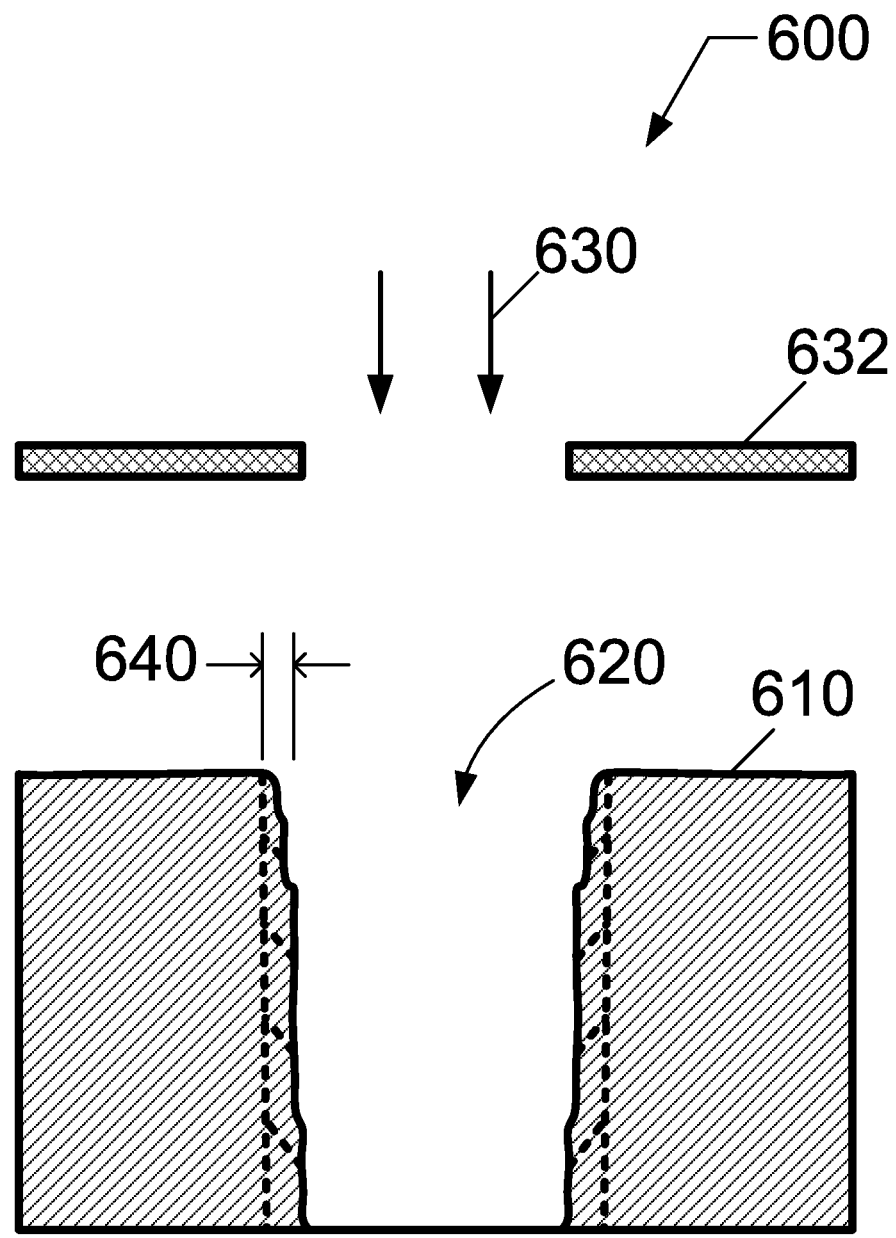
FIGS. 6A and 6B illustrate a method of patterning a substrate.
Figure 6B:
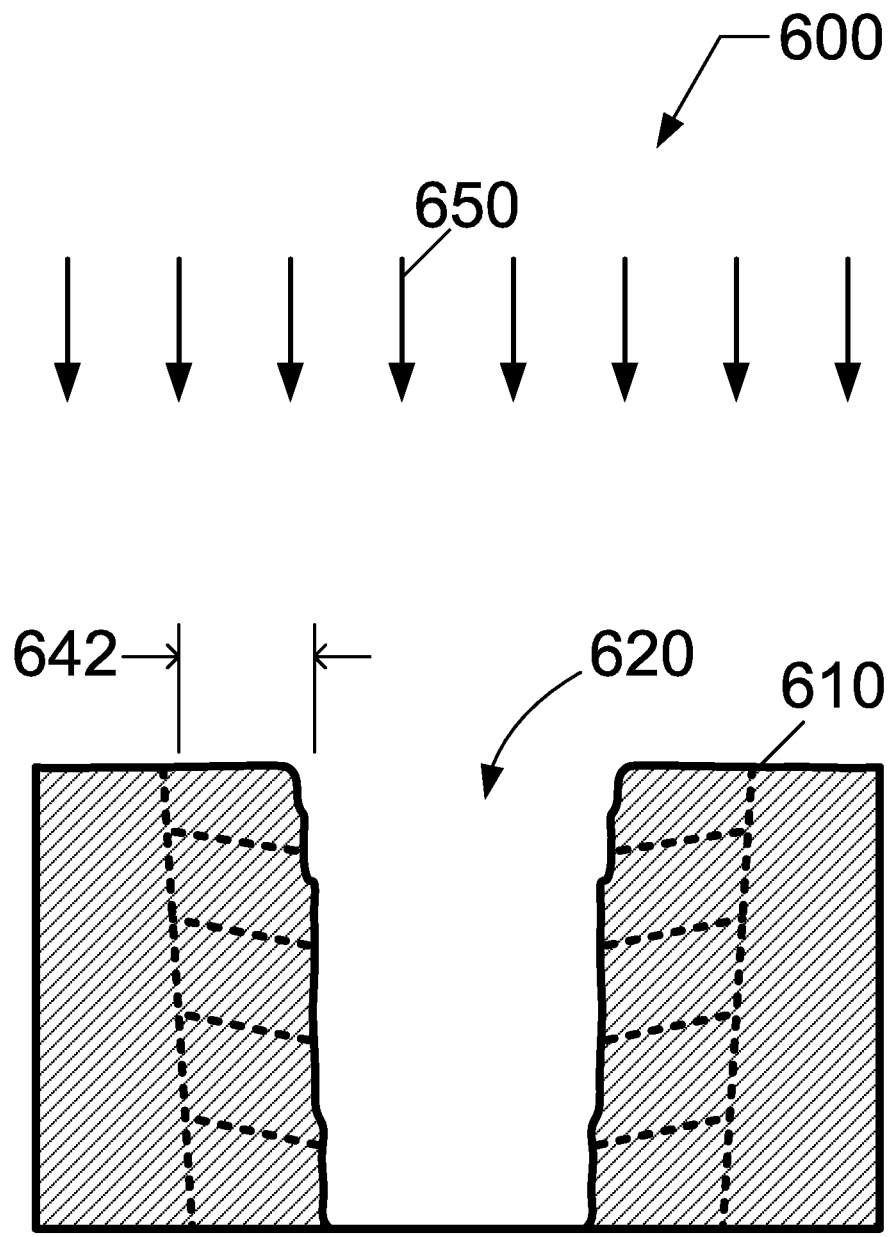

Referring now to FIGS. 6A and 6B, a schematic illustration of a patterned substrate 600 is illustrated. The patterned substrate 600 comprises a layer of radiation-sensitive material 610 within which a feature pattern 620 is formed following the patterned exposure of the layer of radiation-sensitive material 610 to EM radiation 630 through mask 632, the first PEB, and the positive-tone developing. As schematically shown in FIG. 6A, a de-protection gradient is concentrated within boundary layer 640 adjacent an inner edge of the feature pattern 620. However, as shown in FIG. 6B, the de-protection gradient is manipulated or altered further by a flood exposure 650 and a second PEB, and the de-protection gradient extends across an expanded boundary layer 642. In the latter, the practitioner is provided greater flexibility in selecting a width of the remaining structure (i.e., the one or more third radiation-sensitive material portions). The inventors suspect that the flood exposure 650 causes acid generation in areas of the layer of radiation-sensitive material 610 that "consume" or react with a sufficient amount of base to cause a shift in the location of the de-protection gradient during the second PEB.

As described above, the layer of radiation-sensitive material may comprise one or more photo-acid generators. For example, the layer of radiation-sensitive material may comprise a first photo-acid generator and a second photo-acid generator, wherein the first photo-acid generator generates acid in the layer of radiation-sensitive material when exposed to EM radiation at a first wavelength or first range of wavelengths and the second photo-acid generator generates acid in the layer of radiation-sensitive material when exposed to EM radiation at a second wavelength or second range of wavelengths. Each photo-acid generator may be targeted for a specific wavelength or range of wavelengths. Therein, a photo-acid generator may be formulated to generate acid at a target wavelength and generate little to no acid beyond a pre-determined cut-off wavelength. As a result, acid generation in the layer of radiation-sensitive material may be adjusted by altering the spectral content of the EM radiation in the patterned exposure and/or flood exposure.

The patterned exposure may be configured for exposing the layer of radiation-sensitive material to the first wavelength or first range of wavelengths, and the flood exposure may be configured for exposing the layer of radiation-sensitive material to the second wavelength or second range of wavelengths. For example, in a two photo-acid generator system, the patterned exposure may be performed at 193 nm and the flood exposure may be performed at 436 or 365 nm. One of the two photo-acid generators generates acid when exposed to the patterned exposure at 193 nm, and the other of the two photo-acid generators generates acid when exposed to the flood exposure at 436 or 365 nm. Alternatively, the flood exposure may be configured for exposing the layer of radiation-sensitive material to the first wavelength or first range of wavelengths and to the second wavelength or second range of wavelengths.

According to additional embodiments, the first critical dimension, the second critical dimension, and/or third critical dimension (corresponding to the critical dimension of the third radiation-sensitive material portions) are adjusted, controlled and/or optimized to meet pre-specified pattern requirements that may include a pre-specified first critical dimension, second critical dimension, and/or third critical dimension (corresponding to the critical dimension of the third radiation-sensitive material portions). This adjusting, controlling and/or optimizing include altering the patterning process. The adjusting, controlling, and/or optimizing may comprise altering the composition of the layer of radiation-sensitive material, altering the patterned exposure, altering the first post-exposure bake, altering the positive-tone developing, altering the flood exposure, altering the second post-exposure bake, or altering the negative-tone developing, or altering any combination of two or more thereof.

For example, the adjusting of the patterning process to achieve a target first critical dimension and/or second critical dimension, and/or a target critical dimension for the critical dimension of third radiation-sensitive material portions comprises performing one or more of the following: (1) adjusting the mask critical dimension for the patterned exposure; (2) adjusting an exposure dose for the patterned exposure; (3) adjusting an exposure intensity for the patterned exposure; (4) adjusting an exposure wavelength for the patterned exposure; (5) adjusting the first post-exposure temperature, the time the substrate is elevated to the first post-exposure temperature, the heating rate for achieving the first post-exposure temperature, the cooling rate for reducing the first post-exposure temperature, the pressure of a gaseous environment surrounding the substrate during the elevation of the substrate to the first post-exposure temperature, or a composition of the gaseous environment surrounding the substrate during the elevation of the substrate to the first post-exposure temperature, or a combination of two or more thereof; (6) adjusting the second post-exposure temperature, the time the substrate is elevated to the second post-exposure temperature, the heating rate for achieving the second post-exposure temperature, the cooling rate for reducing the second post-exposure temperature, the pressure of a gaseous environment surrounding the substrate during the elevation of the substrate to the second post-exposure temperature, or a composition of the gaseous environment surrounding the substrate during the elevation of the substrate to the second post-exposure temperature, or a combination of two or more thereof; (7) adjusting the composition of the first developing chemistry, the time duration for applying the first developing chemistry, or a temperature of the first developing chemistry, or a combination of two or more thereof; (8) adjusting the composition of the second developing chemistry, the time duration for applying the second developing chemistry, or a temperature for the second developing chemistry, or a combination of two or more thereof; or (9) adjusting a composition of the layer of radiation-sensitive material (e.g., multi-photo-acid generator system); or (10) adjusting a combination of two or more thereof.

Figure 7:
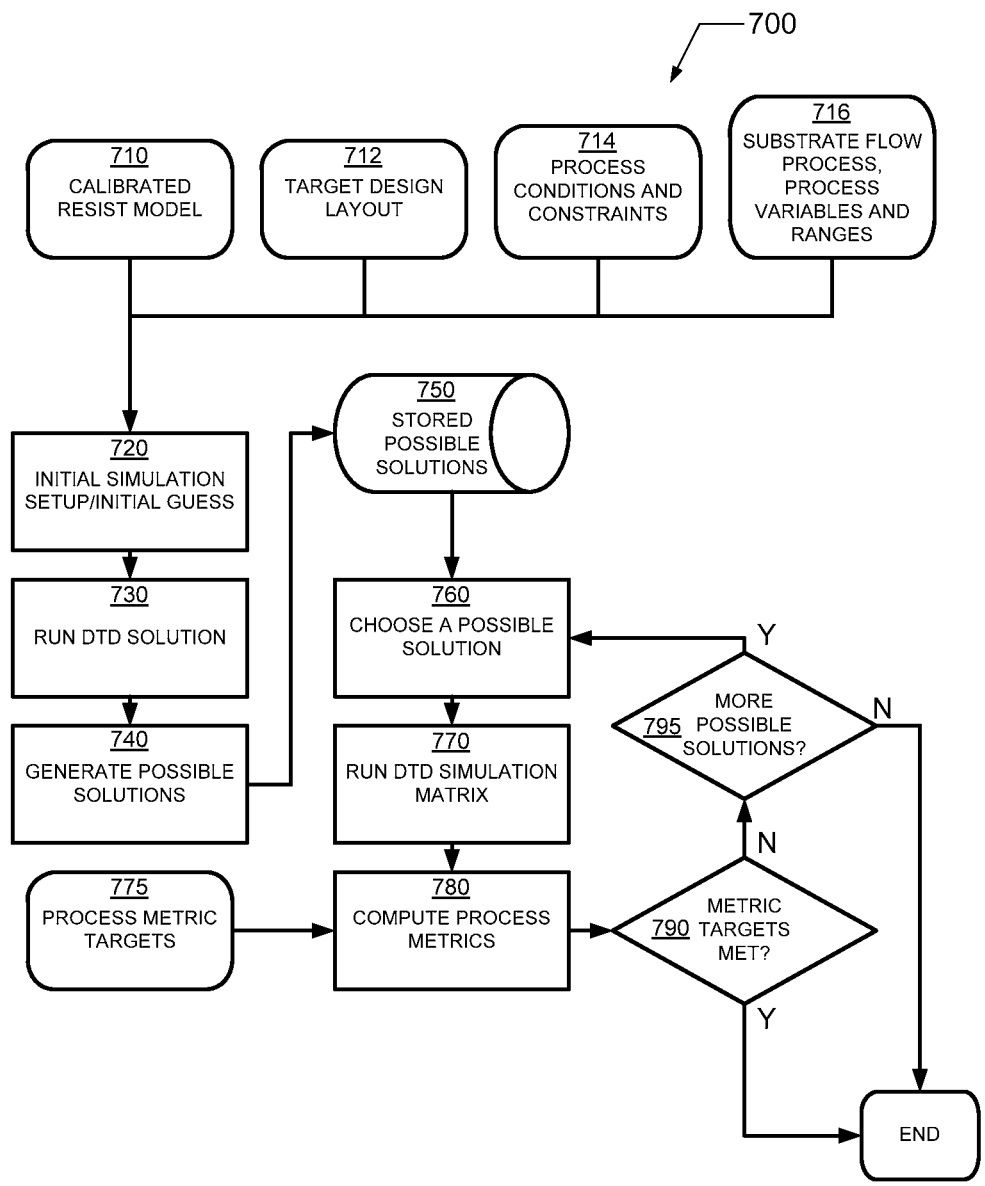
FIG. 7 illustrates an algorithm for optimizing a patterning method according to an embodiment.

Referring now to FIG. 7, an algorithm 700 for optimizing a patterning method is presented according to an embodiment. The algorithm 700 facilitates an optimization methodology based on process centering for a dual tone development (DTD) process that includes both simulation and experimental flows. In algorithm 700, known details about a given target dual tone development process are provided as inputs to an optimization routine that searches and/or computes an ideal process operating condition for the dual tone development process. The optimization routine may incorporate use of "intelligent" routines or software code that is used as the engine for searching for an optimum solution to the dual tone development process.

According to embodiments of the invention, algorithm 700 may be modified for use with any substrate flow. It is assumed that all potential substrate flows may possess the following:
(1) A given target layout (e.g., target geometries, target pitches, and designs);
(2) A given resist material that can be calibrated with a resist model;
(3) A starting or nominal resolution enhancement technique (RET) that specifies a nominal set of optical conditions to produce an image onto the substrate plane (e.g., illumination source shape, numerical aperture (NA) setting, mask assist features, etc.);
(4) A target process flow (e.g., details of coating and bake steps, etc.); and
(5) Target process tolerances for certain process metrics (e.g., mask error enhancement factor (MEEF), exposure latitude, depth of focus (DOF), PEB time sensitivity, PEB temperature sensitivity, etc.).

A goal of the optimization methodology is to obtain a nominal or centered process condition that yields a dual tone resist image that is accurately sized with respect to a target layout/design. Furthermore, it is considered a "centered" condition if it also meets the target metric tolerance bands.

In algorithm 700, process data are defined for the optimization methodology. The process data includes a calibrated resist process model 710, target design layout data 712, process conditions and constraints data 714, and substrate flow process, process variables and ranges data 716. The target design layout data 712 may include substrate material film stack information (e.g., thickness information, recipes, etc.), exposure tool settings, mask/reticle information, and constraints about such process conditions. Additionally, the substrate flow process may include a process flow that includes a flood exposure, and process variables and ranges of interest may include a any variable that allows achievement of a centered process condition. Process variables, such as exposure focus, exposure dose, mask CD, developer chemistry composition and conditions (e.g., type/strength), flood exposure conditions, and PEB temperature(s) and time(s), are examples of variables that can be varied; however, the algorithm is not limited to this set of process variables.

In 720, an initial simulation and/or guess are assumed and provided as input to the optimization methodology. The initial simulation setup is performed by setting pertinent data according to the established process data (710, 712, 714, 716). An initial guess for the solution of process variables is also chosen based on experience, or may be chosen according to a well-known nominal solution.

In 730, an initial set or matrix of dual tone simulations is run that yields possible solutions to the process variables under investigation. This run, in turn, becomes a "database of possible solutions" that meets certain criteria. All of the results (i.e., good and bad solutions) are stored for later processing. The dimensions of the matrix correspond to the number of variables that are allowed to be varied in the simulations.

In 740, the matrix of simulations from the previous step (730) is parsed and possible solutions are found that satisfy a given criteria. For example, the given criteria may be satisfied when a matrix of solutions is determined where the target geometries are achieved. The data to be stored are the values of the process variables which provide an acceptable solution (i.e., satisfy the criteria).

In 750, process solutions including values of the process variables that yielded a good solution are stored. All pertinent information about the solutions are stored, which may include the values of the process variables, the printed critical dimension, 2-D contours of simulated images, and conditions for all settings, for example.

In 760, a possible solution from the matrix of solutions stored in 750 is chosen. The goal from this point on is to make sure the chosen solution meets other lithographic imaging performance metrics. It is likely that the first solution chosen will not meet all criteria, so this becomes an iterative process.

Once a solution is chosen in 760, a series of simulations are performed in 770 to calculate the predicted lithographic performance given a set of metrics specified in steps 710, 712, 714, and 716.

In 780, the lithographic performance metrics, selected from the identified set of metrics, are computed from the results of the series of simulations performed in 770. The lithographic performance metrics may include, but are not limited to, MEEF, depth-of-focus (DOF), exposure latitude, and integrated process window.

In 790, once the lithographic performance metrics are computed, the lithographic performance metrics are compared with process metric targets 775, or target values and/or specifications. If the lithographic performance metrics do not compare favorably with the process metric targets 775 (i.e., within prescribed tolerances) and more possible solutions 795 exist, then steps 760, 770, and 780 of the algorithm 700 are repeated. Alternatively, if the lithographic performance metrics compare favorably with the process metric targets 775 (i.e., within prescribed tolerances), then an acceptable solution has been determined and the optimization methodology has reached an end. If no solution is found that meets all of the process metric targets 775 and all of the possible solutions 795 are exhausted from the stored possible solutions, the algorithm 700 ends.

Figure 8:
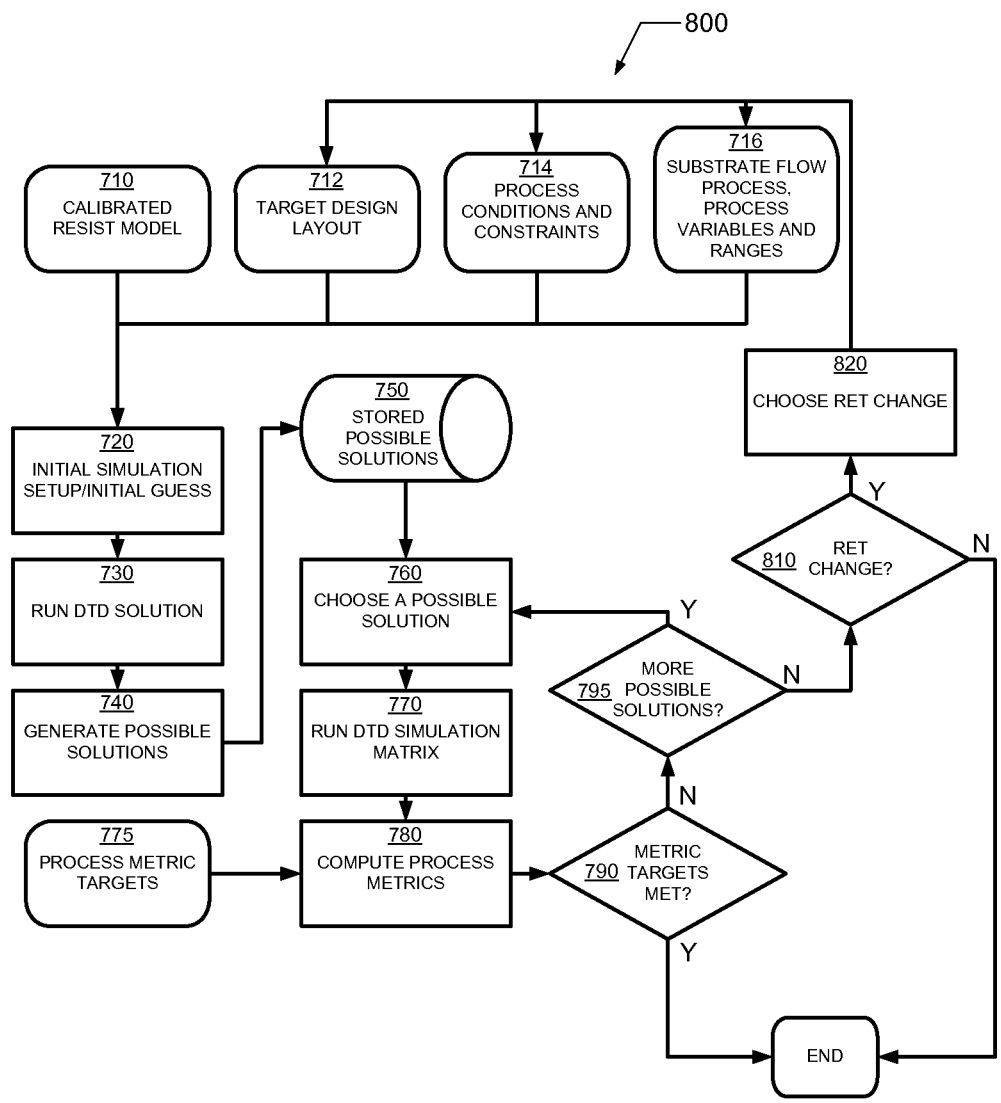
FIG. 8 illustrates an algorithm for optimizing a patterning method according to another embodiment.

Referring now to FIG. 8 an algorithm 800 for optimizing a patterning method is presented according to another embodiment. The algorithm 800 extends the algorithm 700 (described above with reference to FIG. 7) when all of the possible solutions are exhausted from the stored possible solutions 795.

In 810, when all of the possible solutions are exhausted from the stored possible solutions 795, a query is made to determine whether to change the resolution enhance technique (RET). If algorithm 800 elects to change an attribute of the RET, then, in 820, it modifies part or all of the process data that was defined for the optimization methodology (i.e., the calibrated resist process model 710, the target design layout data 712, the process conditions and constraints data 714, and the substrate flow process, process variables and ranges data 716). The changes in the RET are chosen based on experience, or the changes may be chosen based on simulation output from previous steps. Once the change is made, the algorithm begins again in 720. In the end, the RET is changed in order to improve the DTD process and find a better solution. An example of a RET change is a mask bias change and/or an illumination setting change.

Figure 9:
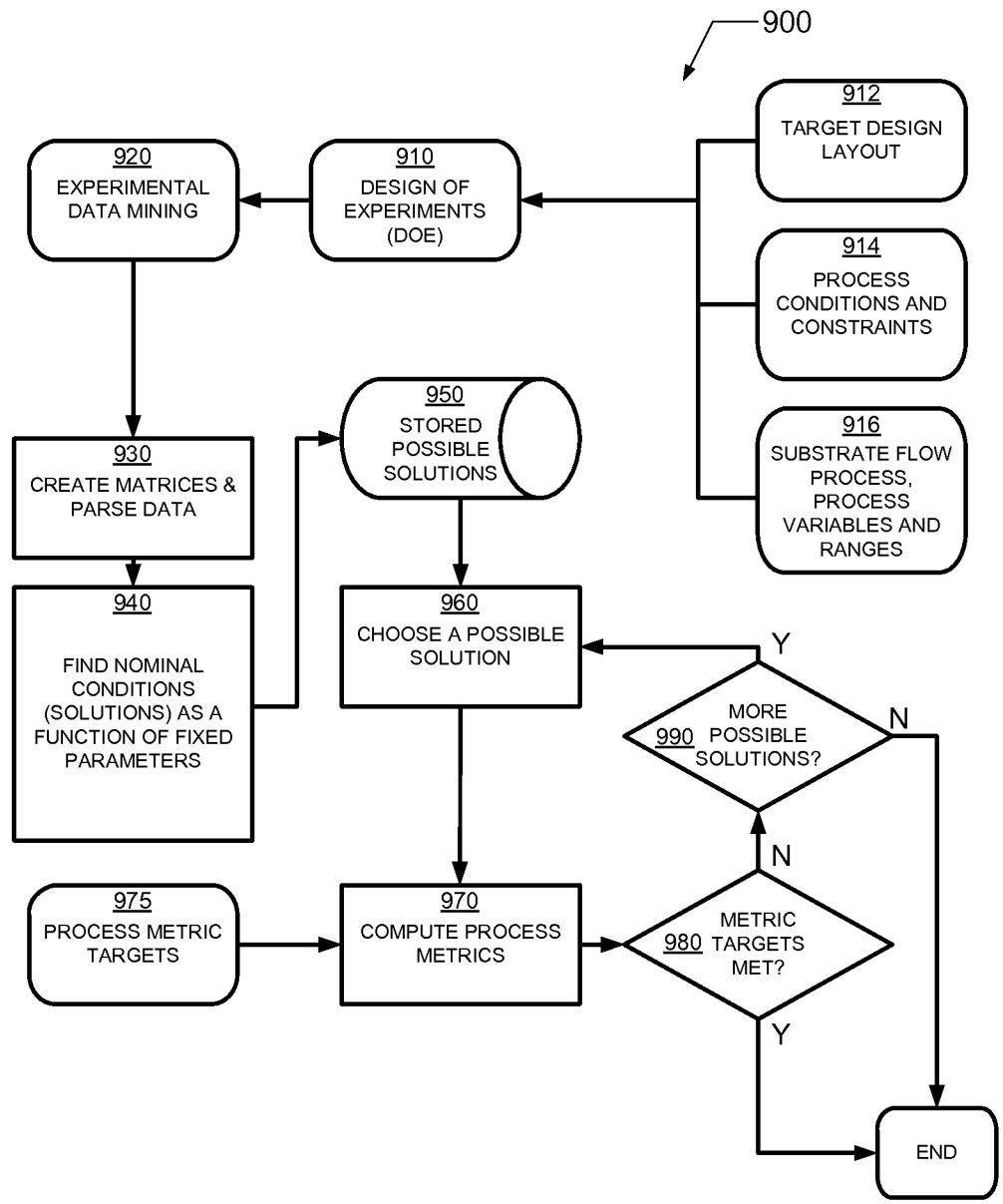
FIG. 9 illustrates an algorithm for optimizing a patterning method according to another embodiment.

Referring now to FIG. 9, an algorithm 900 for optimizing a patterning method is presented according to another embodiment. The algorithm 900 facilitates an optimization methodology based on process centering for a dual tone development (DTD) process that includes experimental data. In algorithm 900, known details about a given target dual tone development process are provided as inputs to an optimization routine that searches and/or determines an ideal process operating condition for the dual tone development process using the experimental data.

According to embodiments of the invention, algorithm 900 may be modified for use with any substrate flow. It is assumed that all potential substrate flows may possess the following:

(1) A given target layout (e.g., target geometries, target pitches, and designs);
(2) A given resist material that can be calibrated with a resist model;
(3) A starting or nominal resolution enhancement technique (RET) that specifies a nominal set of optical conditions to produce an image onto the substrate plane (e.g., illumination source shape, numerical aperture (NA) setting, mask assist features, etc.);
(4) A target process flow (e.g., details of coating and bake steps, etc.); and
(5) Target process tolerances for certain process metrics (e.g., mask error enhancement factor (MEEF), exposure latitude, depth of focus (DOF), PEB time sensitivity, PEB temperature sensitivity, etc.).

A goal of the optimization methodology is to obtain a nominal or centered process condition that yields a dual tone resist image that is accurately sized with respect to a target layout/design. Furthermore, it is considered a "centered" condition if it also meets the target metric tolerance bands.

In algorithm 900, process data are defined for the optimization methodology. The process data includes target design layout data 912, process conditions and constraints data 914, and substrate flow process, process variables and ranges data 916. The target design layout data 912 may include substrate material film stack information (e.g., thickness information, recipes, etc.), exposure tool settings, mask/reticle information, and constraints about such process conditions. Additionally, the substrate flow process may include a process flow that includes a flood exposure, and process variables and ranges of interest may include a any variable that allows achievement of a centered process condition. Process variables, such as exposure focus, exposure dose, developer chemistry composition and conditions (e.g., type/strength), flood exposure conditions, and PEB temperature(s) and time(s), are examples of variables that can be varied; however, the algorithm is not limited to this set of process variables.

In 910, pertinent information about the substrate flow process is used to create and perform a design of experiments (DOE). The DOE is configured to map out a response, such as a critical dimension for a target geometry, as a function of various process variables. The target design layout data 912, process conditions and constraints data 914, and substrate flow process, process variables and ranges data 916 are used to create an appropriate DOE (i.e., matrix of experiments). As an example, the process variables may include: exposure focus, exposure dose, mask CD, developer chemistry composition and conditions (e.g., type/strength), flood exposure conditions, and PEB temperature(s) and time(s).

In 920, experimental data mining is performed by executing the DOE. The experimental data mining determines a response of the DTD process as a function of each of the process variables tested.

In 930, once the response is measured or determined by means of experiments (e.g., metrology equipment, such as a scanning electron microscope (SEM) may be used), a matrix of experimental responses (i.e., "response surfaces") are created and parsed such that possible solutions may be found efficiently.

In 940, using the matrix of experimental responses, possible solutions are found that satisfy a given criteria. For example, the given criteria may be satisfied when a matrix of solutions is determined where the target geometries are achieved. The data to be stored are the values of the process variables which provide an acceptable solution (i.e., satisfy the criteria).

In 950, process solutions including values of the process variables that yielded a good solution are stored. All pertinent information about the solutions are stored, which may include the values of the process variables, the printed critical dimension, 2-D contours of simulated images, and conditions for all settings, for example.

In 960, a possible solution from the matrix of solutions stored in 950 is chosen. The goal from this point on is to make sure the chosen solution meets other lithographic imaging performance metrics. It is likely that the first solution chosen will not meet all criteria, so this becomes an iterative process.

In 970, once a solution is chosen in 960, the lithographic performance metrics are computed from the experimental results for the chosen solution. The lithographic performance metrics may include, but are not limited to, MEEF, depth-of-focus (DOF), exposure latitude, and integrated process window.

In 980, once the lithographic performance metrics are computed, the lithographic performance metrics are compared with process metric targets 975, or target values and/or specifications. If the lithographic performance metrics do not compare favorably with the process metric targets 975 (i.e., within prescribed tolerances) and more possible solutions 990 exist, then steps 960, and 970 of the algorithm 900 are repeated. Alternatively, if the lithographic performance metrics compare favorably with the process metric targets 975 (i.e., within prescribed tolerances), then an acceptable solution has been determined and the optimization methodology has reached an end. If no solution is found that meets all of the process metric targets 975 and all of the possible solutions 995 are exhausted from the stored possible solutions, the algorithm 900 ends. Alternatively, if no solution is found that meets all of the process metric targets 975 and all of the possible solutions 995 are exhausted from the stored possible solutions, then the DOE may be modified and/or expanded, and algorithm 900 may begin again at 920.

Figure 10A:
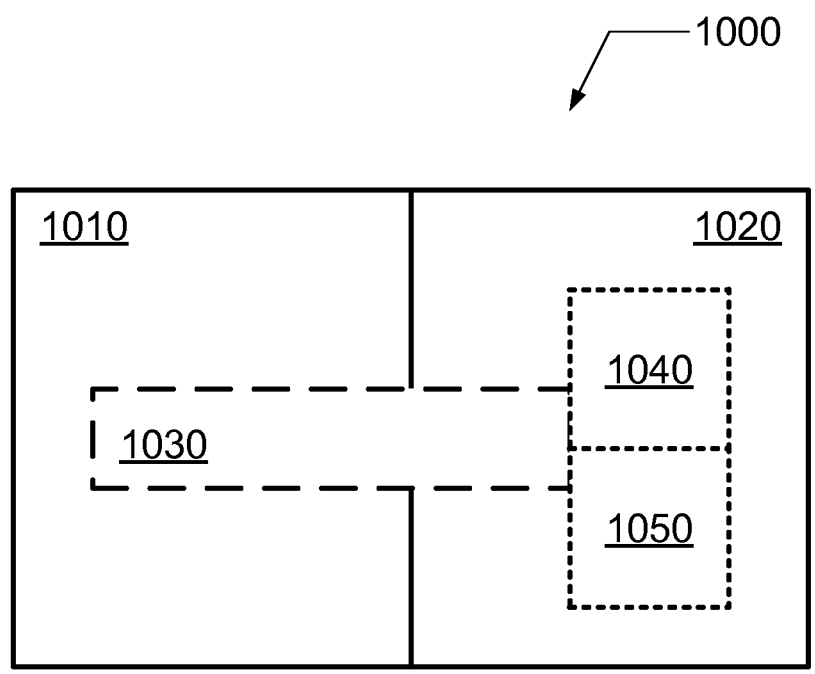
FIGS. 10A through 10C provide a schematic illustration of a platform for patterning a substrate according to several embodiments.

Referring now to FIG. 10A, a platform 1000 configured for patterning a substrate using a dual tone development process is illustrated according to an embodiment. The platform 1000 comprises: a track system 1010 configured to coat a substrate with a layer of radiation-sensitive material; a lithography system 1020 including a pattern exposure system 1040 configured to expose the substrate to patterned EM radiation; a flood exposure system 1050 configured to expose the substrate to un-patterned EM radiation; and a transfer system 1030 configured to transfer the substrate between the track system 1010, the pattern exposure system 1040, and the flood exposure system 1050.

As shown in FIG. 10A, the flood exposure system 1050 may be integrated with the pattern exposure system 1040 within the lithography system 1020. The pattern exposure system 1040 may include a radiation source, a mask imaging system, and a substrate holder. The flood exposure system 1050 may include the radiation source, a mask-less imaging system, and the substrate holder.

Figure 10B:
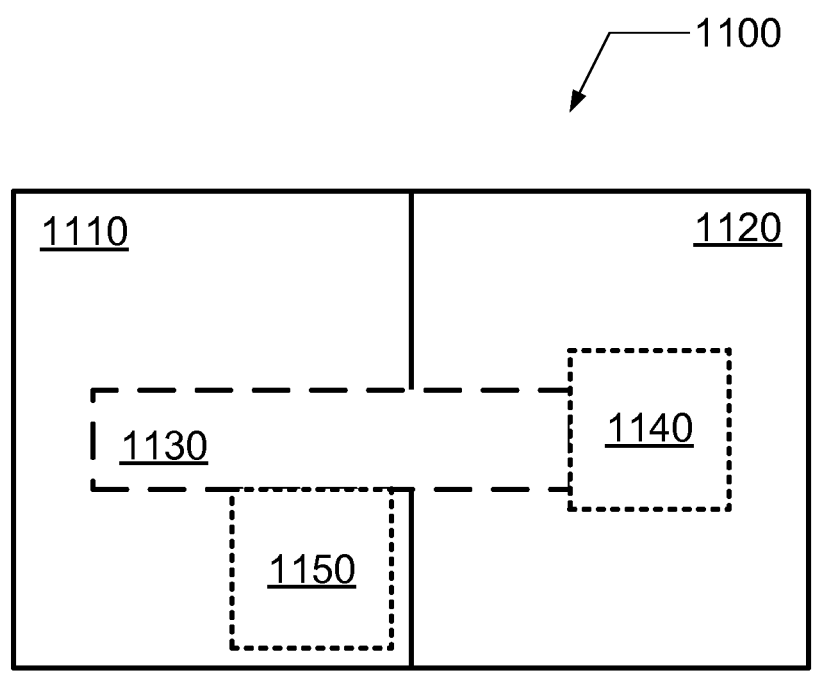

Referring now to FIG. 10B, a platform 1100 configured for patterning a substrate using a dual tone development process is illustrated according to another embodiment. The platform 1100 comprises: a track system 1110 configured to coat a substrate with a layer of radiation-sensitive material; a lithography system 1120 including a pattern exposure system 1140 configured to expose the substrate to patterned EM radiation; a flood exposure system 1150 configured to expose the substrate to un-patterned EM radiation; and a transfer system 1130 configured to transfer the substrate between the track system 1110, the pattern exposure system 1140, and the flood exposure system 1150.

As shown in FIG. 10B, the flood exposure system 1150 may be integrated within the track system 1110. The flood exposure system 1150 may include a radiation source, a mask-less imaging system, and a substrate holder.

Figure 10C:
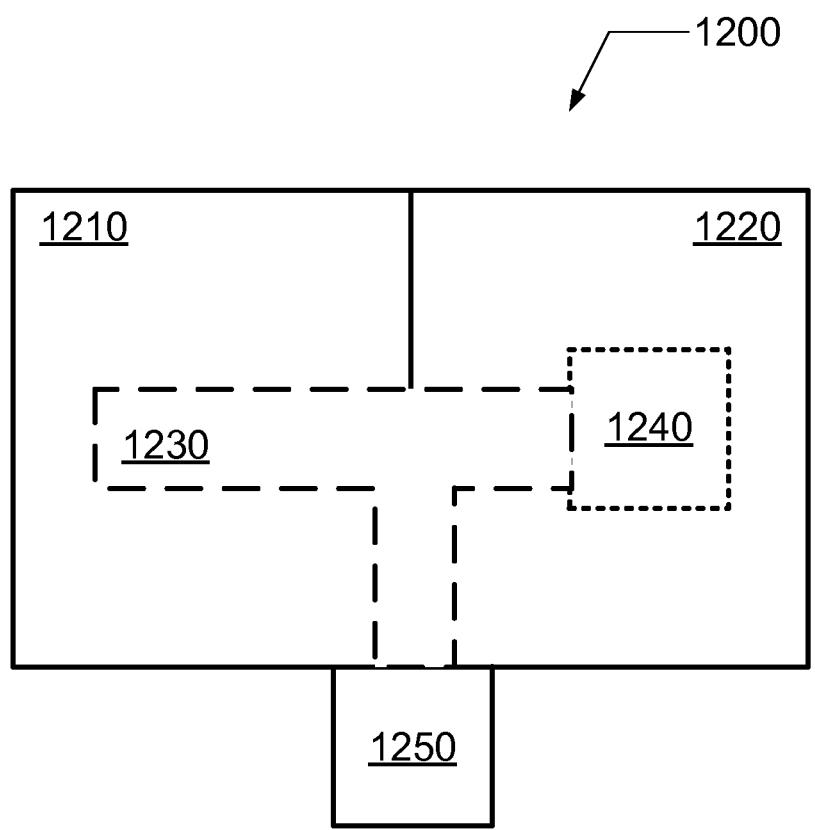

Referring now to FIG. 10C, a platform 1200 configured for patterning a substrate using a dual tone development process is illustrated according to another embodiment. The platform 1200 comprises: a track system 1210 configured to coat a substrate with a layer of radiation-sensitive material; a lithography system 1220 including a pattern exposure system 1240 configured to expose the substrate to patterned EM radiation; a flood exposure system 1250 configured to expose the substrate to un-patterned EM radiation; and a transfer system 1230 configured to transfer the substrate between the track system 1210, the pattern exposure system 1240, and the flood exposure system 1250.

As shown in FIG. 10C, the flood exposure system 1250 may comprise a stand-alone module separate from the track system 1210 and the lithography system 1220, and coupled to the track system 1210 or the lithography system 1220 or both. The flood exposure system 1250 may include a radiation source, a mask-less imaging system, and a substrate holder.

In the embodiments of FIGS. 1A, 10B, and 10C, the flood exposure system (1050, 1150, 1250) is configured to expose the substrate to continuous EM radiation, pulsed EM radiation, poly-chromatic EM radiation, mono-chromatic EM radiation, broad-band EM radiation, or narrow-band radiation, or a combination thereof. The flood exposure system (1050, 1150, 1250) may comprise a radiation source having one or more lamps, one or more LEDs, or one or more lasers, or a combination of two or more thereof.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of patterning a substrate, comprising:
   forming a layer of radiation-sensitive material on a substrate;
   performing a patterned exposure of said layer of radiation-sensitive material using a mask having a mask critical dimension to form first radiation-sensitive material portions having a high radiation exposure, second radiation-sensitive material portions having a low radiation exposure, and third radiation-sensitive material portions having an intermediate radiation exposure;
   performing a first post-exposure bake following said performing said patterned exposure;
   performing positive-tone developing of said layer of radiation-sensitive material to remove said first radiation-sensitive material portions from said substrate;
   performing a flood exposure of said layer of radiation-sensitive material;
   performing a second post-exposure bake following said performing said flood exposure; and
   performing negative-tone developing of said layer of radiation-sensitive material to remove said second radiation-sensitive material portions from said substrate,
   wherein said third radiation-sensitive material portions remain after performing said positive-tone and negative-tone developing.

2. The method of claim 1, further comprising:
   adjusting a critical dimension of said third radiation-sensitive material portions having said intermediate radiation exposure by altering said patterned exposure, said first post-exposure bake, said positive-tone developing, said flood exposure, or said second post-exposure bake, or any combination of two or more thereof.

3. The method of claim 2, wherein said adjusting comprises adjusting said mask critical dimension for said patterned exposure, an exposure dose for said patterned exposure, an exposure intensity for said patterned exposure, an exposure wavelength of said patterned exposure, a first post-exposure temperature for said first post-exposure bake, a time said substrate is elevated to said first post-exposure temperature, a heating rate for achieving said first post-exposure temperature, a cooling rate for reducing said first post-exposure temperature, a pressure of a gaseous environment surrounding said substrate during said elevation of said substrate to said first post-exposure temperature, a composition of a gaseous environment surrounding said substrate during said elevation of said substrate to said first post-exposure temperature, a second post-exposure temperature for said second post-exposure bake, a time said substrate is elevated to said second post-exposure temperature, a heating rate for achieving said second post-exposure temperature, a cooling rate for reducing said second post-exposure temperature, a pressure of a gaseous environment surrounding said substrate during said elevation of said substrate to said second post-exposure temperature, a composition of a gaseous environment surrounding said substrate during said elevation of said substrate to said second post-exposure temperature, a composition of a first developing chemistry for said positive-tone developing, a time duration for applying said first developing chemistry, a temperature of said first developing chemistry, a composition of a second developing chemistry for said negative-tone developing, a time duration for applying said second developing chemistry, a temperature of said second developing chemistry, an exposure dose for said flood exposure, an exposure intensity for said flood exposure, an exposure wavelength of said flood exposure, or a composition of the layer of radiation-sensitive material, or any combination of two or more thereof.

4. The method of claim 1, wherein said performing said flood exposure comprises exposing said substrate to electromagnetic (EM) radiation having a wavelength in the visible spectrum, or EM radiation having a wavelength in the ultraviolet spectrum, or a combination thereof.

5. The method of claim 1, wherein said performing said flood exposure comprises exposing said substrate to continuous EM radiation, pulsed EM radiation, poly-chromatic EM radiation, mono-chromatic EM radiation, broad-band EM radiation, or narrow-band radiation, or a combination thereof.

6. The method of claim 1, wherein said performing said flood exposure comprises exposing said substrate to 436 nm (nanometer) EM radiation, 365 nm EM radiation, 248 nm EM radiation, 193 nm EM radiation, 157 nm EM radiation, or deep ultraviolet (DUV) EM radiation, or any combination of two or more thereof.

7. The method of claim 1, wherein said layer of radiation-sensitive material comprises a positive-tone photo-resist, a dual tone photo-resist, or a photo-resist having one or more photo-acid generators.

8. The method of claim 7, wherein:
said layer of radiation-sensitive material comprises a first photo-acid generator and a second photo-acid generator;
said first photo-acid generator generates acid in said layer of radiation-sensitive material when exposed to EM radiation at a first wavelength or first range of wavelengths; and
said second photo-acid generator generates acid in said layer of radiation-sensitive material when exposed to EM radiation at a second wavelength or second range of wavelengths.

9. The method of claim 8, wherein said performing said patterned exposure is configured for exposing said layer of radiation-sensitive material to said first wavelength or first range of wavelengths, and said performing said flood exposure is configured for exposing said layer of radiation-sensitive material to said second wavelength or second range of wavelengths.

10. The method of claim 8, said performing said flood exposure is configured for exposing said layer of radiation-sensitive material to said first wavelength or first range of wavelengths and to said second wavelength or second range of wavelengths.

11. The method of claim 1, wherein said layer of radiation-sensitive material comprises a photo-resist that switches solubility due to a change in polarity upon said performing said patterned exposure, said performing said flood exposure, said performing said first post-exposure bake following said patterned exposure, or said performing said second post-exposure bake following said flood exposure, or any combination of two or more thereof, or wherein said layer of radiation-sensitive material comprises a photo-resist that provides acid-catalyzed deprotection upon said performing said patterned exposure, said performing said flood exposure, said performing said first post-exposure bake following said patterned exposure, or said performing said second post-exposure bake following said flood exposure, or any combination of two or more thereof.

12. A method of patterning a substrate, comprising:
forming a layer of radiation-sensitive material on a substrate;
performing a patterned exposure of said layer of radiation-sensitive material using a mask having a mask critical dimension to form first radiation-sensitive material portions having a first radiation exposure level that is one of high or low exposure and a first critical dimension, second radiation-sensitive material portions having a second radiation exposure level that is the other of high or low exposure and a second critical dimension, and third radiation-sensitive material portions having a third radiation exposure level intermediate the first and second radiation exposure levels and a third critical dimension;
performing a first post-exposure bake following said performing said patterned exposure;
performing a first development of said layer of radiation-sensitive material to remove said first radiation-sensitive material portions from said substrate;
performing a flood exposure of said layer of radiation-sensitive material to further expose said second and third material portions to radiation;
performing a second post-exposure bake following said performing said flood exposure, wherein said flood exposure and said second post-exposure bake are effective to adjust a de-protection gradient across said second and third material portions and thereby adjust said second and third critical dimensions; and
performing a second development of said layer of radiation-sensitive material to remove said second radiation-sensitive material portions from said substrate,
wherein one of said first or second developments is a positive-tone development for removing the respective first or second radiation-sensitive material portions having the high radiation exposure level and the other of said first or second developments is a negative-tone development for removing the respective first or second radiation-sensitive material portions having the low radiation exposure level, and
wherein said third radiation-sensitive material portions having said adjusted third critical dimension remain after performing said first and second developments.

13. The method of claim 12, wherein said flood exposure is at a wavelength capable of generating acid in said second and third material portions, and wherein said second post-exposure bake causes acid-catalyzed de-protection using said generated acid from said flood exposure to increase said de-protection gradient.

14. The method of claim 13, wherein:
said layer of radiation-sensitive material comprises a first photo-acid generator and a second photo-acid generator;
said first photo-acid generator generates acid in said layer of radiation-sensitive material proportional to said high, intermediate and low radiation exposure levels when exposed to EM radiation at a first wavelength or first range of wavelengths during said patterned exposure; and
said second photo-acid generator generates acid in said layer of radiation-sensitive material proportional to said high or low and said intermediate radiation exposure levels when exposed to EM radiation at a second wavelength or second range of wavelengths during said flood exposure.

* * * * *